(12) United States Patent
Xia

(10) Patent No.: US 11,325,934 B2
(45) Date of Patent: May 10, 2022

(54) ORGANIC LUMINESCENT MATERIALS CONTAINING TETRAPHENYLENE LIGANDS

(71) Applicant: BEIJING SUMMER SPROUT TECHNOLOGY CO., LTD., Beijing (CN)

(72) Inventor: Chuanjun Xia, Lawrenceville, NJ (US)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 331 days.

(21) Appl. No.: 16/132,500

(22) Filed: Sep. 17, 2018

(65) Prior Publication Data

US 2019/0100544 A1    Apr. 4, 2019

Related U.S. Application Data

(60) Provisional application No. 62/566,274, filed on Sep. 29, 2017.

(51) Int. Cl.
| | |
|---|---|
| *C07F 15/00* | (2006.01) |
| *H01L 51/50* | (2006.01) |
| *H01L 51/00* | (2006.01) |

(52) U.S. Cl.
CPC ...... *C07F 15/0086* (2013.01); *C07F 15/0033* (2013.01); *H01L 51/0085* (2013.01);
(Continued)

(58) Field of Classification Search
CPC ...... C07F 1/08; C07F 1/10; C07F 1/12; C07F 15/0006; C07F 15/002; C07F 15/0033; C07F 15/0046; C07F 15/006; C07F 15/0073; C07F 15/0086; C07F 19/00; C07F 19/005; H01L 51/0084; H01L 51/0085;
(Continued)

(56) References Cited

U.S. PATENT DOCUMENTS

| | | |
|---|---|---|
| 5,703,436 A | 12/1997 | Forrest et al. |
| 5,707,745 A | 1/1998 | Forrest et al. |

(Continued)

FOREIGN PATENT DOCUMENTS

| | | |
|---|---|---|
| EP | 2602302 A2 | 12/2013 |
| JP | 2007246617 | 9/2007 |
| WO | WO0141512 A1 * | 6/2001 |

OTHER PUBLICATIONS

Hong Zhi Xie et al. "Reduction of Self-Quenching Effect in Organic Electrophosphorescence Emitting Devices via the Use of Sterically Hindered Spacers in Phosphorescence Molecules", Adv. Mater. 2001, vol. 13, p. 1245-1248, (Year: 2001).*

(Continued)

*Primary Examiner* — Jennifer A Boyd
*Assistant Examiner* — Seokmin Jeon
(74) *Attorney, Agent, or Firm* — Workman Nydegger

(57) ABSTRACT

Organic luminescent materials containing tetraphenylene ligands are disclosed, which can be used as emitters in the emissive layer of an organic electroluminescent device. The organic luminescent materials is metal complexes which comprise a new series of tetraphenylene ligands. The use of these novel ligands can decrease aggregation in the solid state and improve the lifetime of device. Also disclosed are an electroluminescent device and a formulation.

14 Claims, 3 Drawing Sheets

Figure 1:
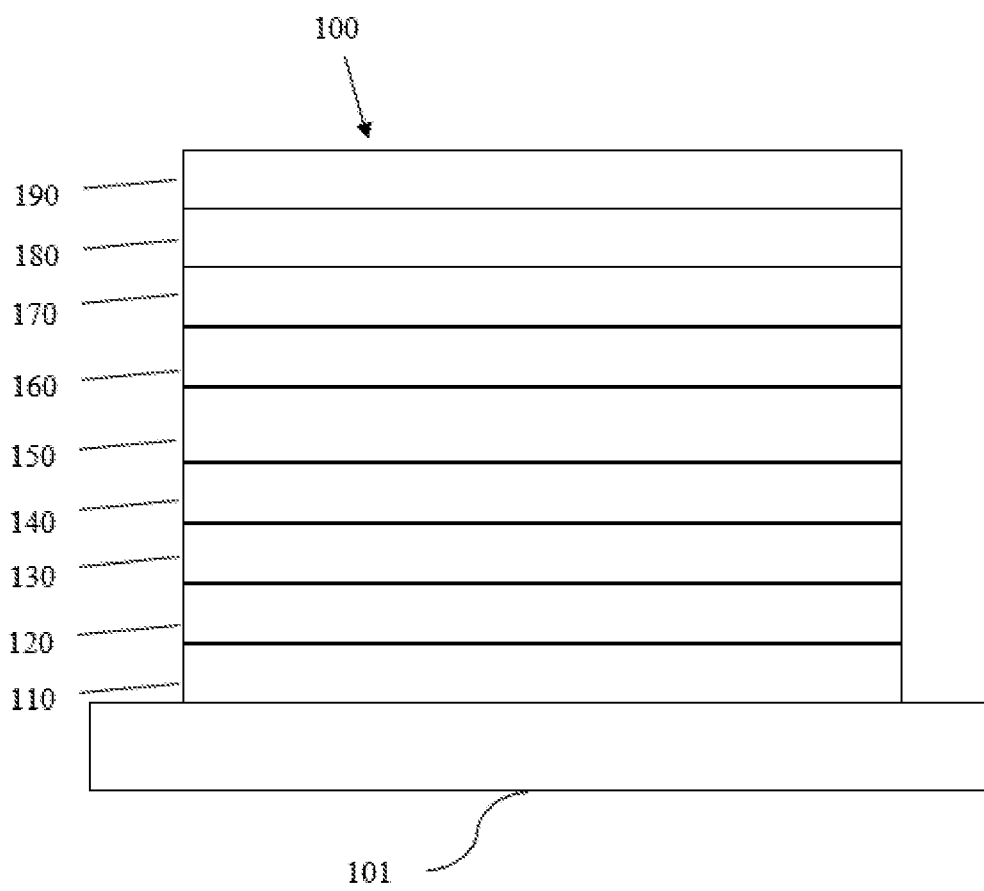

(52) U.S. Cl.
CPC ...... *H01L 51/5024* (2013.01); *H01L 51/0057* (2013.01); *H01L 51/0058* (2013.01); *H01L 51/0087* (2013.01); *H01L 51/5016* (2013.01)

(58) Field of Classification Search
CPC ............. H01L 51/0086; H01L 51/0087; H01L 51/0088; H01L 51/009; H01L 51/0091
See application file for complete search history.

(56) References Cited

U.S. PATENT DOCUMENTS

| | | | |
|---|---|---|---|
| 5,844,363 | A | 12/1998 | Gu et al. |
| 6,097,147 | A | 8/2000 | Baldo et al. |
| 6,303,238 | B1 | 10/2001 | Thompson et al. |
| 7,279,704 | B2 | 10/2007 | Walters et al. |
| 7,968,146 | B2 | 6/2011 | Wagner et al. |
| 2003/0230980 | A1 | 12/2003 | Forrest et al. |
| 2004/0174116 | A1 | 9/2004 | Lu et al. |
| 2006/0134460 | A1* | 6/2006 | Kondakova .................. 428/690 |
| 2008/0194853 | A1* | 8/2008 | Kim ................................ 556/13 |
| 2009/0108737 | A1* | 4/2009 | Kwong ........................ 313/504 |
| 2010/0133524 | A1* | 6/2010 | Kim ................................ 257/40 |
| 2013/0075716 | A1* | 3/2013 | Nishimura .......... H01L 51/5016 |
| 2015/0349273 | A1 | 12/2015 | Hung et al. |
| 2016/0359122 | A1 | 12/2016 | Boudreault et al. |
| 2017/0077409 | A1* | 3/2017 | Kwong .............. H01L 51/0055 |
| 2019/0115541 | A1 | 4/2019 | Xia |

OTHER PUBLICATIONS

Shih-Chun Lo et al. "High-Triplet-Energy Dendrons: Enhancing the Luminescence of Deep Blue Phosphorescent Iridium(III) Complexes", J. Am. Chem. Soc. 2009, vol. 131, p. 16681-16688 (Year: 2009).*

Zhi-Qiang Zhu et al. "Harvesting All Electrogenerated Excitons through Metal Assisted Delayed Fluorescent Materials", Adv. Mater. 2015, vol. 27, 2533-2537 (Year: 2015).*

Machine translated English version of WO 2000/027946 A1, Shizuo Tokito (Year: 2000).*

Tang, C. W. et al., "Organic electroluminescent diodes", Applied Physics Letters, 51(12): 913-915 (1987).

Hiroki Uoyama et al., "Highly efficient organic light-emitting diodes from delayed fluorescence", Nature, vol. 492, pp. 234-238 (2012).

Chinese Office Action issued in Application No. 201811141367.X dated Oct. 10, 2020.

Search Report cited in Application No. 201811141367.X dated Oct. 10, 2020.

King, K.A., et al., "Excited-State Properties of a Triply Ortho-Metalated Iridium (III) Complex", J. AM. Chem. Soc. 1985, 107, 1431-1432.

Mori, Tomohiko, et al., "Improving the thermal stability of organic light-emitting diodes by using a modified phthalocyanine layer", Applied Physics Letters, vol. 80k No. 21, May 27, 2002; accepted for publication Mar. 27, 2002.

* cited by examiner

ORGANIC LUMINESCENT MATERIALS CONTAINING TETRAPHENYLENE LIGANDS

This application claims the benefit of U.S. Provisional Application No. 62/566,274, filed Sep. 29, 2017, the entire content of which is incorporated herein by reference.

1 FIELD OF THE INVENTION

The present invention relates to a compound for organic electronic devices, such as organic light emitting devices. More specifically, the present invention relates to a metal complex with tetraphenylene containing ligands, an electroluminescent device and a formulation comprising the metal complex.

2 BACKGROUND ART

An organic electronic device is preferably selected from the group consisting of organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (Applied Physics Letters, 1987, 51 (12): 913-915). Once a bias is applied to the device, green light was emitted from the device. This invention laid the foundation for the development of modern organic light-emitting diodes (OLEDs). State-of-the-art OLEDs may comprise multiple layers such as charge injection and transporting layers, charge and exciton blocking layers, and one or multiple emissive layers between the cathode and anode. Since OLED is a self-emitting solid state device, it offers tremendous potential for display and lighting applications. In addition, the inherent properties of organic materials, such as their flexibility, may make them well suited for particular applications such as fabrication on flexible substrates.

OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of a fluorescent OLED is only 25%. This limitation hindered the commercialization of OLED. In 1997, Forrest and Thompson reported phosphorescent OLED, which uses triplet emission from heave metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. Small molecule refers to any organic or organometallic material that is not a polymer. The molecular weight of a small molecule can be large as long as it has well defined structure. Dendrimers with well-defined structures are considered as small molecules. Polymer OLEDs include conjugated polymers and non-conjugated polymers with pendant emitting groups. Small molecule OLED can become a polymer OLED if post polymerization occurred during the fabrication process.

There are various methods for OLED fabrication. Small molecule OLEDs are generally fabricated by vacuum thermal evaporation. Polymer OLEDs are fabricated by solution process, such as spin-coating, ink-jet printing, and nozzle printing. Small molecule OLEDs can also be fabricated by solution process if the materials can be dissolved or dispersed in solvents.

The emitting color of an OLED can be achieved by emitter structural design. An OLED may comprise one emitting layer or a plurality of emitting layers to achieve desired spectrum. In the case of green, yellow, and red OLEDs, phosphorescent emitters have successfully reached commercialization. Blue phosphorescent emitters still suffer from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

3 SUMMARY OF THE INVENTION

The present invention aims to provide a new series of metal complex with tetraphenylene containing ligands to solve at least part of the above problems. The metal complex can be used as emitters in the emissive layer of an organic electroluminescent device. Due to the unique structure of tetraphenylene, the use of these ligands can reduce the aggregation in the solid state and provide efficient and long-lifetime devices.

According to an embodiment of the present invention, a metal complex is disclosed, which comprising a partial structure represented by Formula 1:

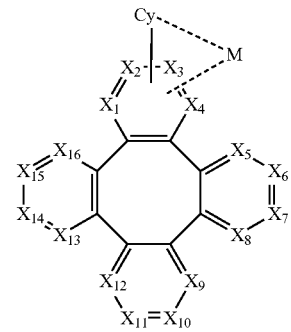

Formula 1

Wherein

Cy is a substituted or unsubstituted aryl or heteroaryl group having 5 to 24 aromatic ring atoms;

Cy is bonded to M via a carbon atom or nitrogen atom;

M is selected from the group consisting of Cu, Ag, Au, Ru, Rh, Pd, Os, Ir, and Pt;

$X_1$ to $X_{16}$ are independently selected from N, C, or CR;

wherein R is selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, nitrile, isonitrile, sulfanyl, sulfinyl, sulfonyl, phosphino, and combinations thereof;

two adjacent substituents are optionally joined to form a ring;

$X_1$, $X_2$, $X_3$ or $X_4$ is connected to M through a metal-carbon bond or metal-nitrogen bond.

According to another embodiment, an electroluminescent device is disclosed, which comprising:

an anode, a cathode, and an organic layer, disposed between the anode and the cathode, comprising a meal complex comprising a partial structure represented by Formula 1:

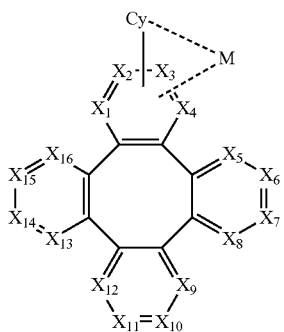

Formula 1

Wherein

Cy is a substituted or unsubstituted aryl or heteroaryl group having 5 to 24 aromatic ring atoms;

Cy is bonded to M via a carbon atom or nitrogen atom;

M is selected from the group consisting of Cu, Ag, Au, Ru, Rh, Pd, Os, Ir, and Pt;

$X_1$ to $X_{16}$ are independently selected from N, C, or CR;

R is selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, nitrile, isonitrile, sulfanyl, sulfinyl, sulfonyl, phosphino, and combinations thereof;

two adjacent substituents are optionally joined to form a ring.

$X_1$, $X_2$, $X_3$ or $X_4$ is connected to M through a metal-carbon bond or metal-nitrogen bond.

According to yet another embodiment, a formulation comprising a metal complex is also disclosed. Said metal complex comprises a partial structure represented by Formula 1.

The metal complex comprising new tetraphenylene containing ligands disclosed in the present invention can be used as emitters in the emissive layer of the organic electroluminescent device. Due to the unique structure of tetraphenylene, these new ligands can reduce the aggregation in the solid state. The ligands and compounds can be easily used in the manufacture of OLEDs, which can provide efficient OLEDs and long lifetime.

4 BRIEF DESCRIPTION OF THE DRAWINGS

FIG. 1 schematically shows an organic light emitting device that can incorporate the ligands, metal complex and formulation disclosed herein.

Figure 2:
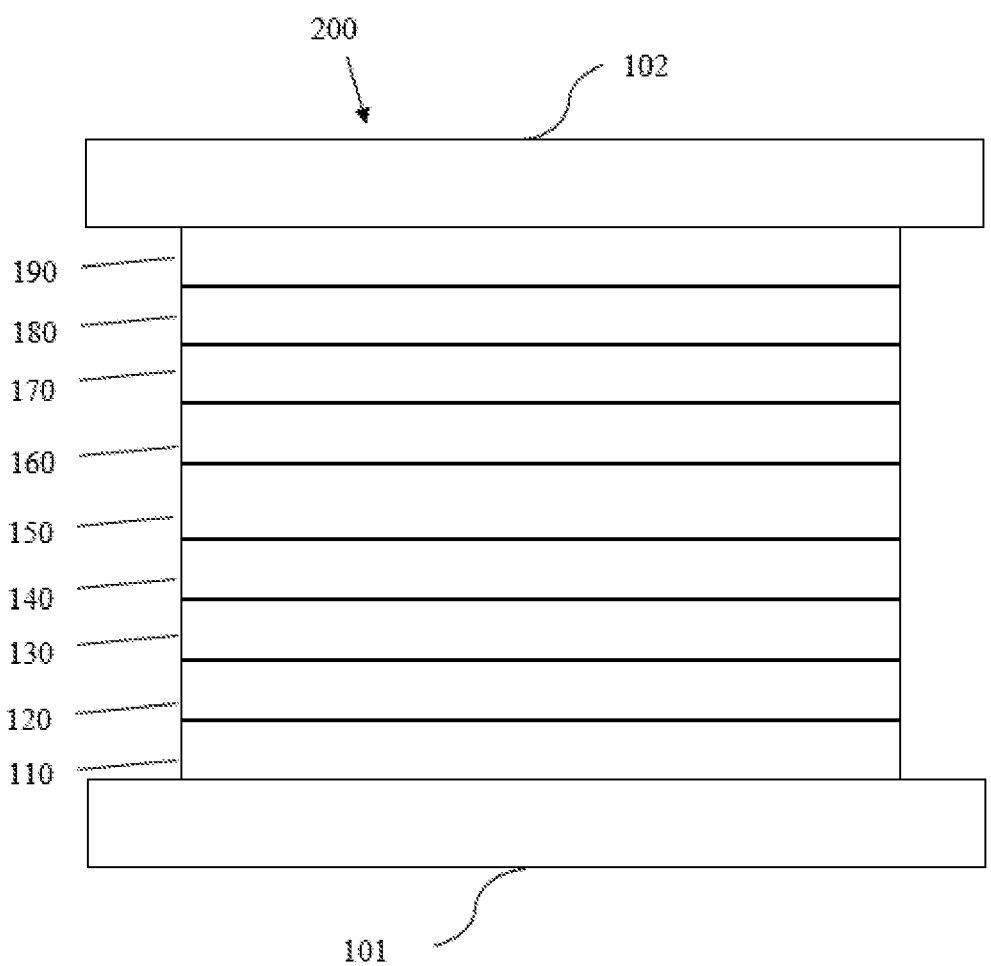

FIG. 2 schematically shows another organic light emitting device that can incorporate the ligands, metal complex and formulation disclosed herein.

Figure 3:
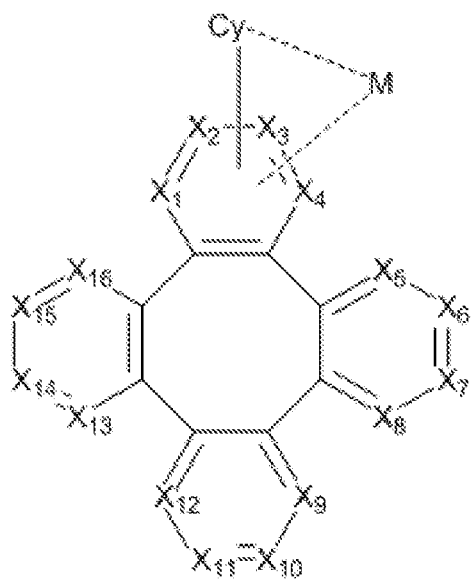

FIG. 3 shows the Formula 1 of metal complex having a partial structure disclosed herein.

5 DETAILED DESCRIPTION

OLEDs can be fabricated on various types of substrates such as glass, plastic, and metal foil. FIG. 1 schematically shows the organic light emitting device 100 without limitation. The figures are not necessarily drawn to scale. Some of the layer in the figure can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, which are incorporated by reference in its entirety.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F4-TCNQ at a molar ratio of 50:1, as disclosed in U.S. Patent Application Publication No. 2003/0230980, which is incorporated by reference in its entirety. Examples of host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

The layered structure described above is provided by way of non-limiting example. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have a two layers of different emitting materials to achieve desired emission spectrum.

In one embodiment, an OLED may be described as having an "organic layer" disposed between a cathode and an anode. This organic layer may comprise a single layer or multiple layers.

An OLED can be encapsulated by a barrier layer to protect it from harmful species from the environment such as moisture and oxygen. FIG. 2 schematically shows the organic light emitting device 200 without limitation. FIG. 2 differs from FIG. 1 in that the organic light emitting device 200 include a barrier layer 102, which is above the cathode 190. Any material that can provide the barrier function can be used as the barrier layer such as glass and organic-inorganic hybrid layers. The barrier layer should be placed directly or indirectly outside of the OLED device. Multi-layer thin film encapsulation was described in U.S. Pat. No. 7,968,146, which is herein incorporated by reference in its entirety.

Devices fabricated in accordance with embodiments of the invention can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta E_{S-T}$). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small $\Delta E_{S-T}$. These states may involve CT states. Often, donor-acceptor luminescent materials are constructed by connecting an electron donor moiety such as amino- or carbazole-derivatives and an electron acceptor moiety such as N-containing six-membered aromatic rings.

Definition of Terms of Substituents halogen or halide—as used herein includes fluorine, chlorine, bromine, and iodine.

Alkyl—contemplates both straight and branched chain alkyl groups. Examples of the alkyl group include methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 2-methylpentyl group, 1-pentylhexyl group, 1-butylpentyl group, 1-heptyloctyl group, 3-methylpentyl group. Additionally, the alkyl group may be optionally substituted. The carbons in the alkyl chain can be replaced by other hetero atoms. Of the above, preferred are methyl group, ethyl group, propyl group, isopropyl group, n-butyl group, s-butyl group, isobutyl group, t-butyl group, n-pentyl group, and neopentyl group.

Cycloalkyl—as used herein contemplates cyclic alkyl groups. Preferred cycloalkyl groups are those containing 4 to 10 ring carbon atoms and includes cyclobutyl, cyclopentyl, cyclohexyl, 4-methylcyclohexyl, 4,4-dimethylcylcohexyl, 1-adamantyl, 2-adamantyl, 1-norbornyl, 2-norbornyl and the like. Additionally, the cycloalkyl group may be optionally substituted. The carbons in the ring can be replaced by other hetero atoms.

Alkenyl—as used herein contemplates both straight and branched chain alkene groups. Preferred alkenyl groups are those containing two to fifteen carbon atoms. Examples of the alkenyl group include vinyl group, allyl group, 1-butenyl group, 2-butenyl group, 3-butenyl group, 1,3-butandienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl1-butenyl group, and 3-phenyl-1-butenyl group. Additionally, the alkenyl group may be optionally substituted.

Alkynyl—as used herein contemplates both straight and branched chain alkyne groups. Preferred alkynyl groups are those containing two to fifteen carbon atoms. Additionally, the alkynyl group may be optionally substituted.

Aryl or aromatic group—as used herein contemplates noncondensed and condensed systems. Preferred aryl groups are those containing six to sixty carbon atoms, preferably six to twenty carbon atoms, more preferably six to twelve carbon atoms. Examples of the aryl group include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Additionally, the aryl group may be optionally substituted. Examples of the non-condensed aryl group include phenyl group, biphenyl-2-yl group, biphenyl-3-yl group, biphenyl-4-yl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 4'-methylbiphenylyl group, 4"-t-butyl p-terphenyl-4-yl group, o-cumenyl group, m-cumenyl group, p-cumenyl group, 2,3-xylyl group, 3,4-xylyl group, 2,5-xylyl group, mesityl group, and m-quarterphenyl group.

Heterocyclic group or heterocycle—as used herein contemplates aromatic and non-aromatic cyclic groups. Heteroaromatic also means heteroaryl. Preferred non-aromatic heterocyclic groups are those containing 3 to 7 ring atoms which includes at least one hetero atom such as nitrogen, oxygen, and sulfur. The heterocyclic group can also be an aromatic heterocyclic group having at least one heteroatom selected from nitrogen atom, oxygen atom, sulfur atom, and selenium atom.

Heteroaryl—as used herein contemplates noncondensed and condensed hetero-aromatic groups that may include from one to five heteroatoms. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—it is represented by —O-Alkyl. Examples and preferred examples thereof are the same as those described above. Examples of the alkoxy group having 1 to 20 carbon atoms, preferably 1 to 6 carbon atoms include methoxy group, ethoxy group, propoxy group, butoxy group, pentyloxy group, and hexyloxy group. The alkoxy group having 3 or more carbon atoms may be linear, cyclic or branched.

Aryloxy—it is represented by —O-Aryl or —O-heteroaryl. Examples and preferred examples thereof are the same as those described above. Examples of the aryloxy group having 6 to 40 carbon atoms include phenoxy group and biphenyloxy group.

Arylalkyl—as used herein contemplates an alkyl group that has an aryl substituent. Additionally, the arylalkyl group may be optionally substituted. Examples of the arylalkyl group include benzyl group, 1-phenylethyl group, 2-phenylethyl group, 1-phenylisopropyl group, 2-phenylisopropyl group, phenyl-t-butyl group, alpha.-naphthylmethyl group, 1-alpha.-naphthylethyl group, 2-alpha-naphthylethyl group, 1-alpha-naphthylisopropyl group, 2-alpha-naphthylisopropyl group, beta-naphthylmethyl group, 1-beta-naphthylethyl group, 2-beta-naphthylethyl group, 1-beta-naphthylisopropyl group, 2-beta-naphthylisopropyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro2-phenylisopropyl group. Of the above, preferred are benzyl group, p-cyanobenzyl group, m-cyanobenzyl group, o-cyanobenzyl group, 1-phenylethyl group, 2-phenylethyl group, 1-phenylisopropyl group, and 2-phenylisopropyl group.

The term "aza" in azadibenzofuran, aza-dibenzothiophene, etc. means that one or more of the C—H groups in the respective aromatic fragment are replaced by a nitrogen atom. For example, azatriphenylene encompasses dibenzo[f,h]quinoxaline,dibenzo[f,h]quinoline and other analogues with two or more nitrogens in the ring system. One of ordinary skill in the art can readily envision other nitrogen analogs of the aza-derivatives described above, and all such analogs are intended to be encompassed by the terms as set forth herein.

The alkyl, cycloalkyl, alkenyl, alkynyl, aralkyl, heterocyclic group, aryl, and heteroaryl may be unsubstituted or may be substituted with one or more substituents selected from the group consisting of deuterium, halogen, alkyl, cycloalkyl, arylalkyl, alkoxy, aryloxy, amino, cyclic amino, silyl, alkenyl, cycloalkenyl, heteroalkenyl, alkynyl, aryl, heteroaryl, an acyl group, a carbonyl group, a carboxylic acid group, an ether group, an ester group, a nitrile group, an isonitrile group, a sulfanyl group, a sulfinyl group, a sulfonyl group, a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In the compounds mentioned in this disclosure, the hydrogen atoms can be partially or fully replaced by deuterium. Other atoms such as carbon and nitrogen, can also be replaced by their other stable isotopes. The replacement by other stable isotopes in the compounds may be preferred due to its enhancements of device efficiency and stability.

In the compounds mentioned in this disclosure, multiple substitutions refer to a range that includes a double substitution, up to the maximum available substitutions.

In the compounds mentioned in this disclosure, the expression that adjacent substituents are optionally joined to form a ring is intended to be taken to mean that two radicals are linked to each other by a chemical bond. This is illustrated by the following scheme:

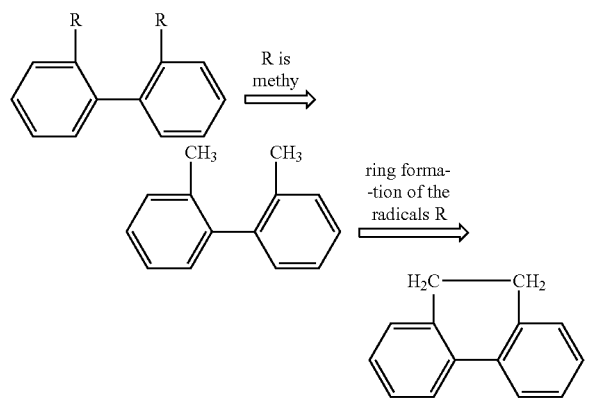

Furthermore, the expression that adjacent substituents are optionally joined to form a ring is also intended to be taken to mean that in the case where one of the two radicals represents hydrogen, the second radical is bonded at a position to which the hydrogen atom was bonded, with formation of a ring. This is illustrated by the following scheme:

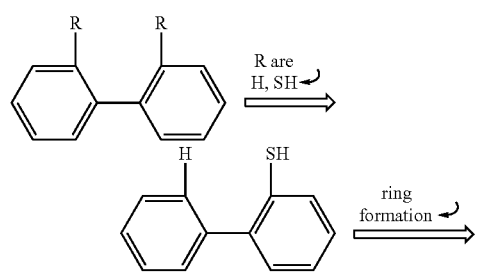

-continued

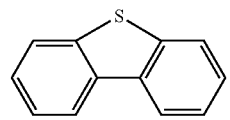

According to an embodiment of the present invention, a metal complex having a partial structure represented by Formula 1 is disclosed:

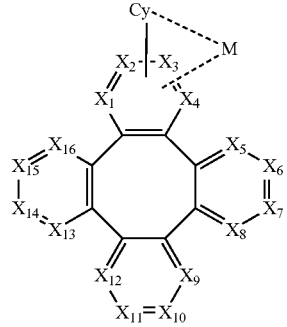

Formula 1

Wherein
Cy is a substituted or unsubstituted aryl or heteroaryl group having 5 to 24 aromatic ring atoms;
Cy is bonded to M via a carbon atom or nitrogen atom;
M is metal, preferably selected from the group consisting of Cu, Ag, Au, Ru, Rh, Pd, Os, Ir, and Pt;
$X_1$ to $X_{16}$ are independently selected from N, C, or CR;
wherein R is selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, nitrile, isonitrile, sulfanyl, sulfinyl, sulfonyl, phosphino, and combinations thereof;
two adjacent substituents are optionally joined to form a ring;
$X_1$, $X_2$, $X_3$ or $X_4$ is connected to M through a metal-carbon bond or metal-nitrogen bond;
In this embodiment, when Cy is a substituted aryl or heteroaryl group having 5 to 24 aromatic ring atoms, it means that a mono-substitution, a di-substitution, or up to the maximum available substitutions may be present on the aryl or heteroaryl group having 5 to 24 aromatic ring atoms. The above substitutions may each independently be selected from the group consisting of deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof.

In one embodiment, wherein the metal is selected from the group consisting of Pt and Ir.

In one embodiment, wherein Cy has a partial structure selected from the group consisting of:

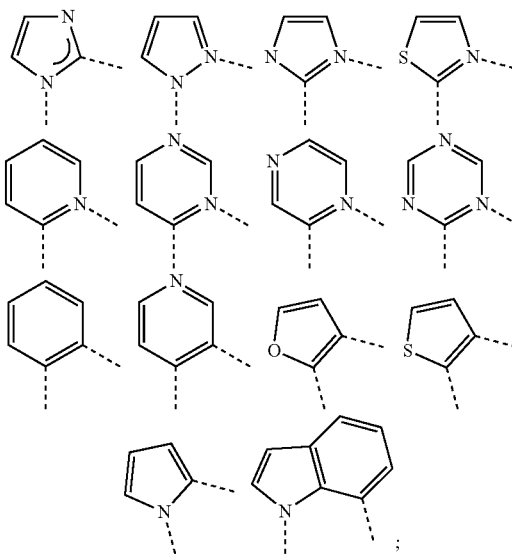

In this embodiment, Cy has a partial structure selected from the above group, it means that Cy comprises a substituted or unsubstituted group selected from the above group. When Cy is the substituted group, it means that there may be a mono-substitution, a di-substitution, or up to the maximum available substitution on the group. The above substitutions may each independently be selected from the group consisting of deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof.

In one embodiment, wherein the complex has the formula of $M(L_a)_m(L_b)_n(L_c)_q$, wherein $L_b$ and $L_c$ are the second and third ligand coordinating to M, $L_b$ and $L_c$ can be the same of different;

$L_a$, $L_b$, and $L_c$ can be optionally joined to form a tetradentate or hexadentate ligand;

Wherein m is 1, 2, or 3, n is 0, 1, or 2, q is 0, 1, or 2; m+n+q is the oxidation state of M.

In one embodiment, Wherein $L_a$ is independently selected from the group consisting of:

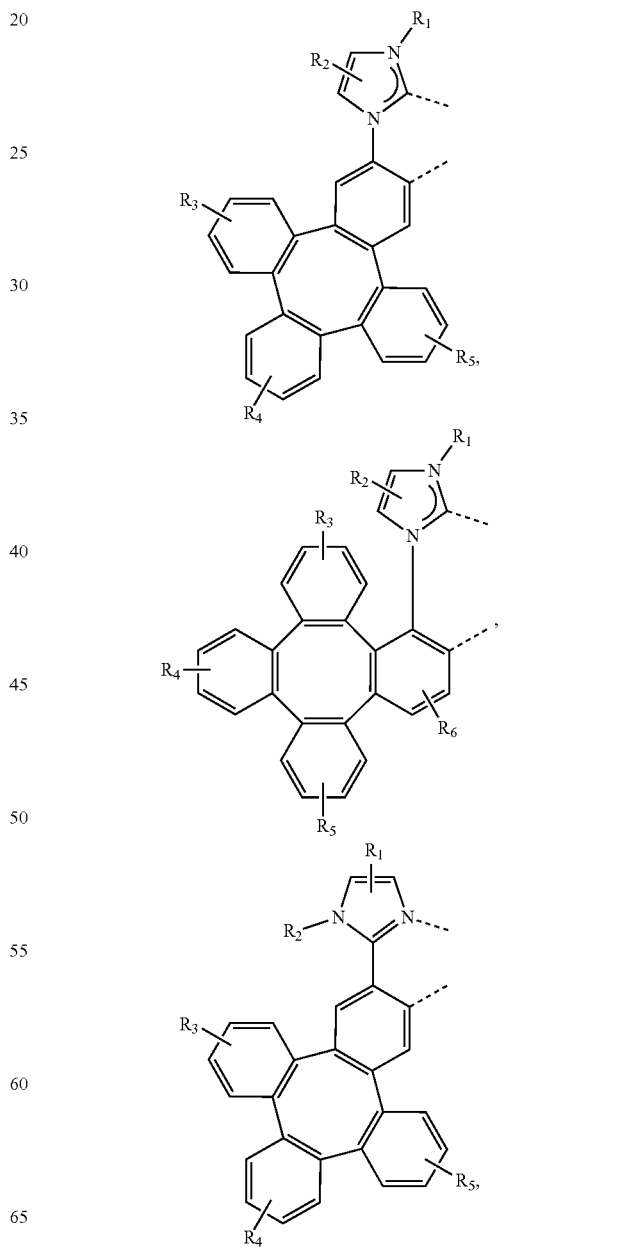

-continued
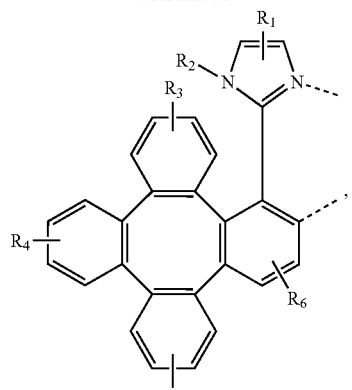
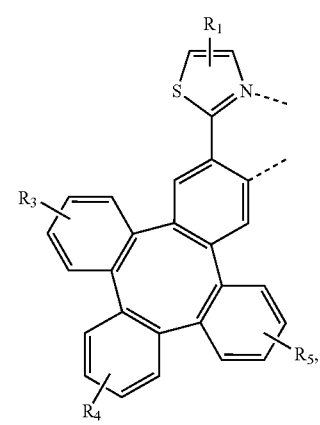
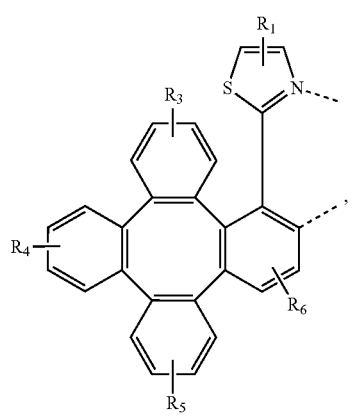
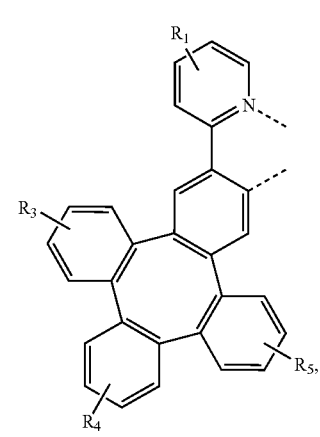
-continued
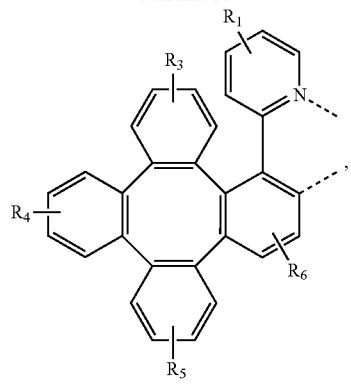
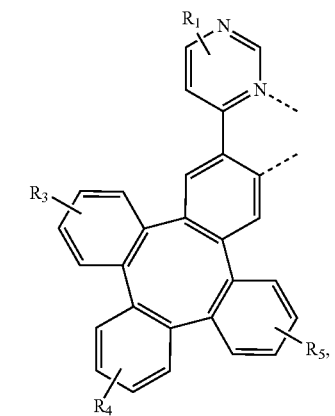
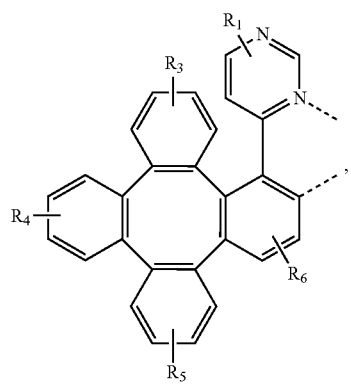
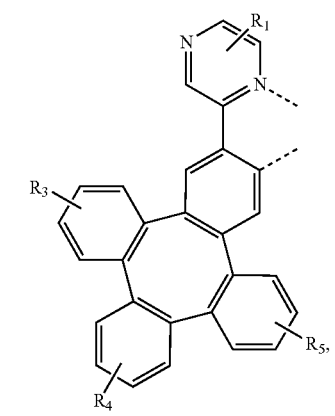

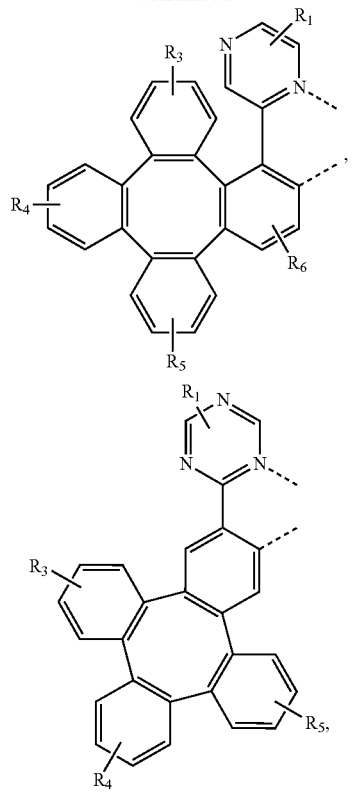
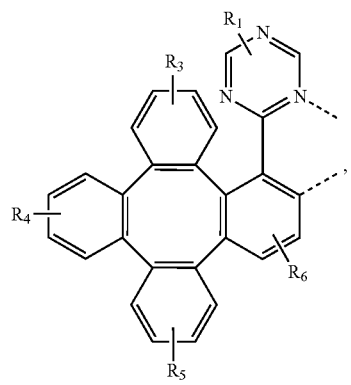
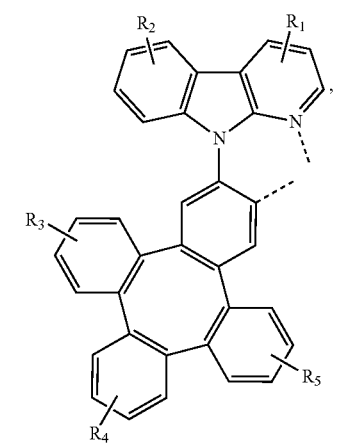
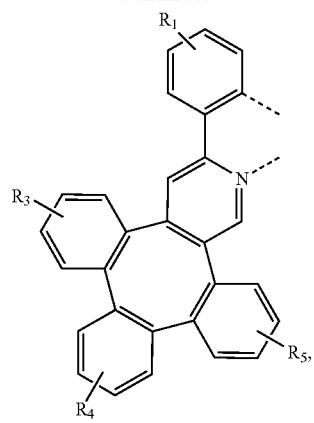
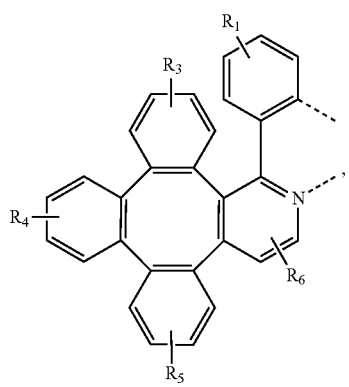
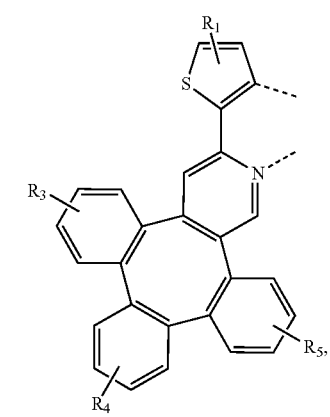
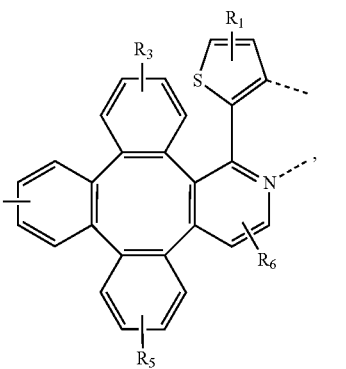
and -continued

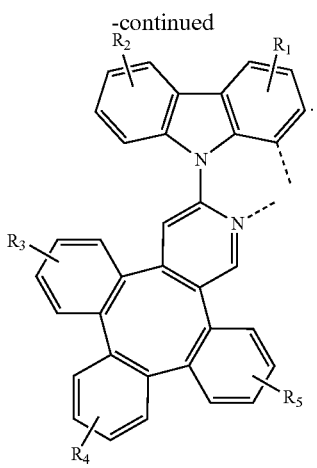

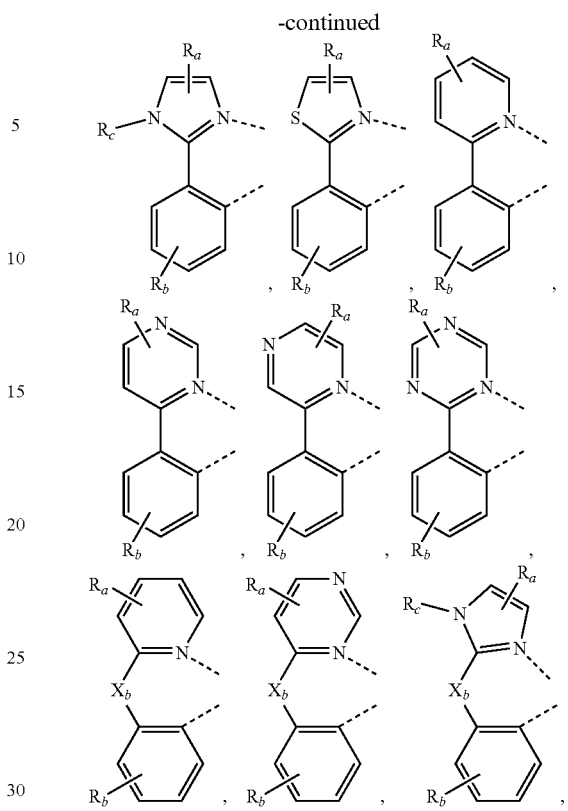

Wherein

R₁, R₂, R₃, R₄, R₅, and R₆ can represent mono, di, tri, or tetra substitution or no substitution;

R₁, R₂, R₃, R₄, R₅, and R₆ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, nitrile, isonitrile, sulfanyl, sulfinyl, sulfonyl, phosphino, and combinations thereof.

two adjacent substituents are optionally joined to form a ring.

In one embodiment, wherein $L_b$ and are independently selected from the group consisting of:

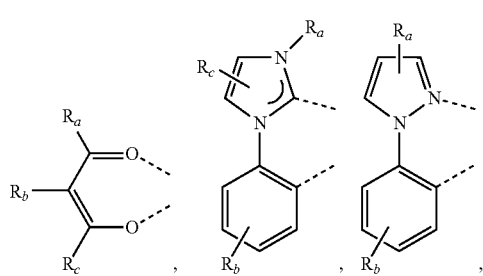

Wherein $R_a$, $R_b$, and $R_c$ can represent mono, di, tri, or tetra substitution or no substitution;

$R_a$, $R_b$, and $R_c$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, nitrile, isonitrile, sulfanyl, sulfinyl, sulfonyl, phosphino, and combinations thereof; adjacent substituents $R_a$, $R_b$, and $R_c$ are optionally joined to form a ring;

$X_b$ is selected from the group consisting of O, S, Se, $NR_{N1}$, and $CR_{C1}R_{C2}$;

$R_{N1}$, $R_{C1}$ and $R_{C2}$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

two adjacent substituents are optionally joined to form a ring.

In one embodiment, wherein the $L_a$ is selected from the group consisting of:

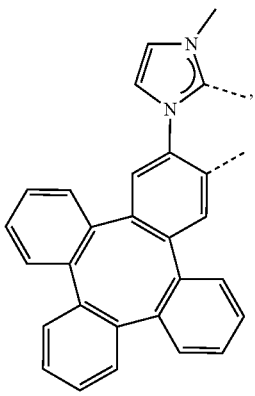

$L_{a1}$

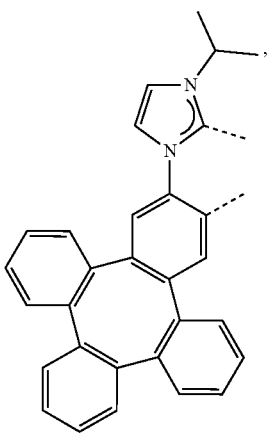

$L_{a2}$

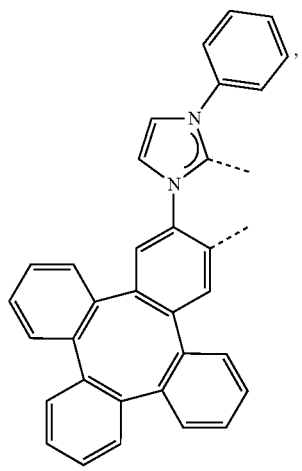

$L_{a3}$

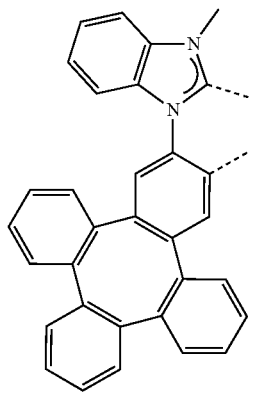

$L_{a4}$

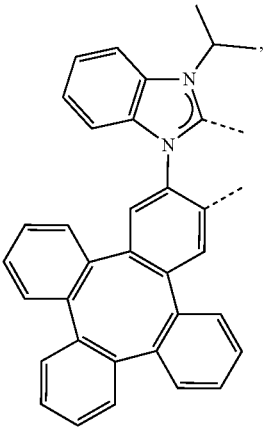

$L_{a5}$

L<sub>a6</sub>
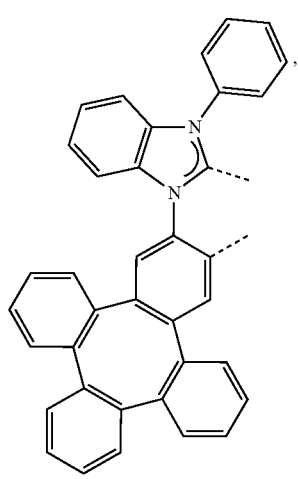
L<sub>a7</sub>
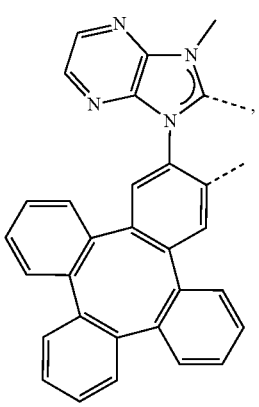
L<sub>a8</sub>
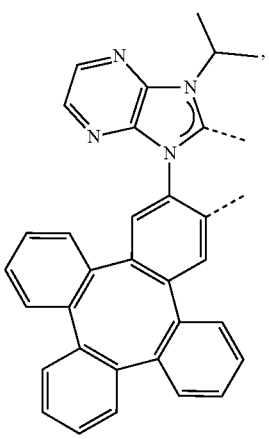
L<sub>a9</sub>
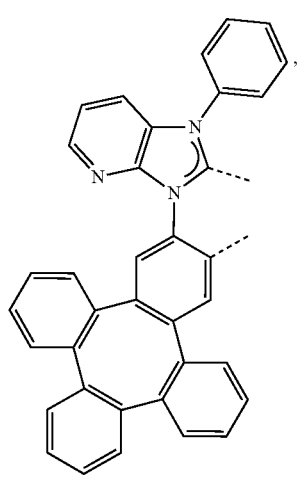
L<sub>a10</sub>
L<sub>a11</sub>

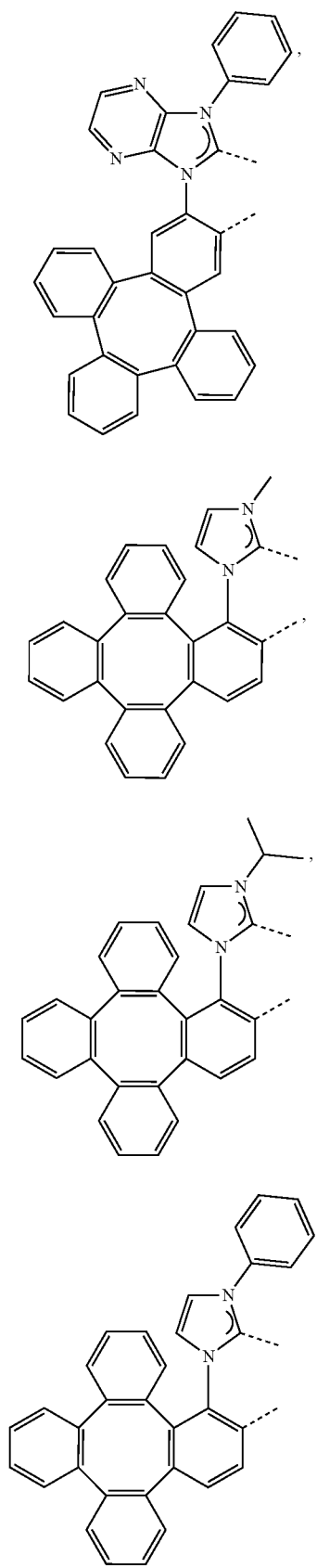
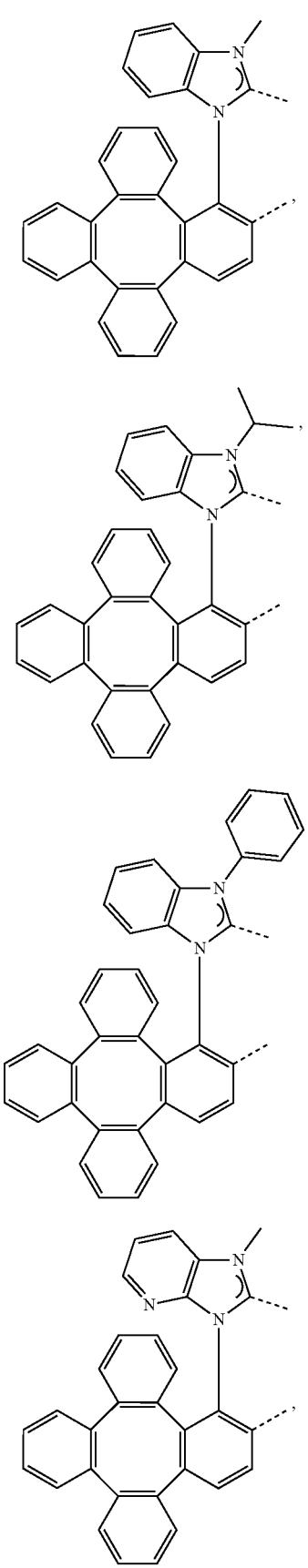

25
-continued
L_{a20}
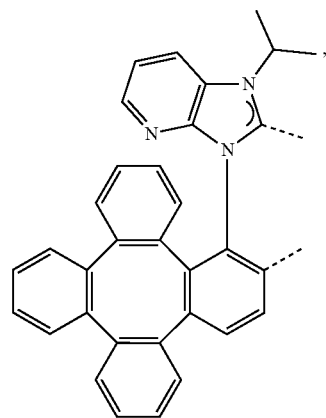
L_{a21}
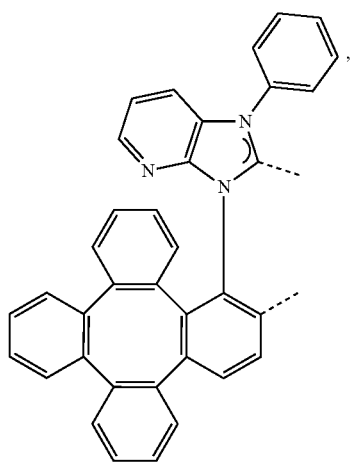
L_{a22}
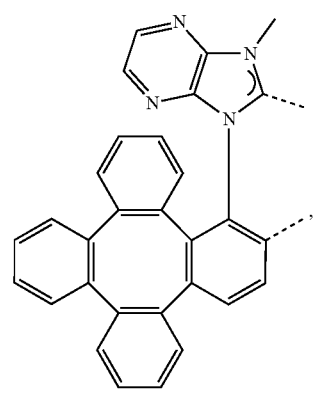
26
-continued
L_{a23}
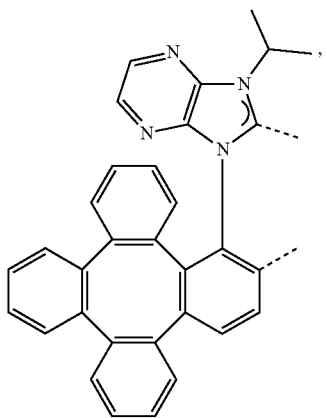
L_{a24}
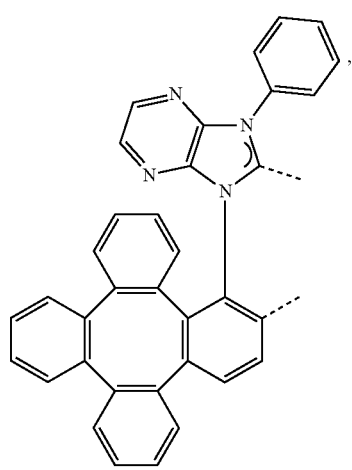
L_{a25}
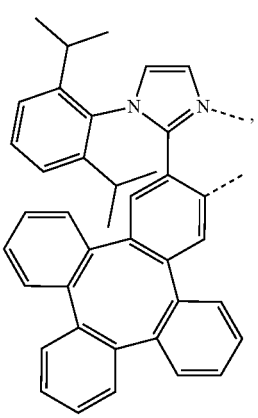

-continued
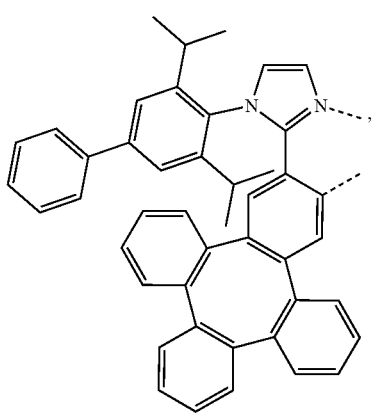
L<sub>a26</sub>
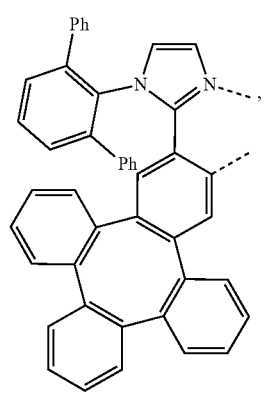
L<sub>a27</sub>
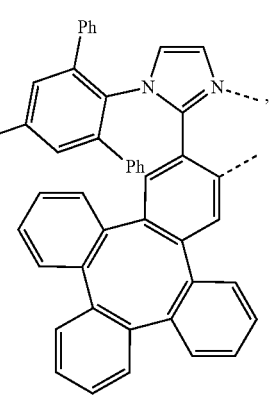
L<sub>a28</sub>
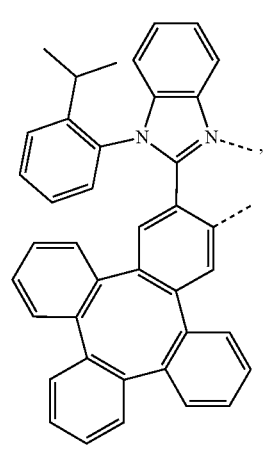
L<sub>a29</sub>
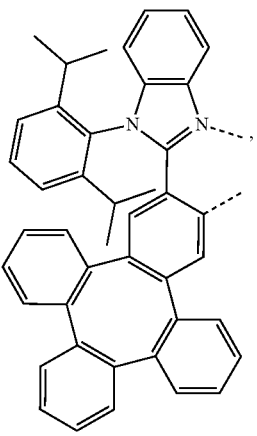
L<sub>a30</sub>
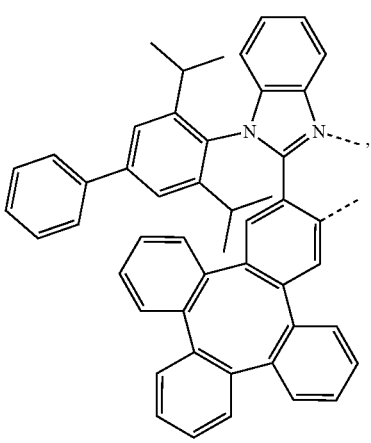
L<sub>a31</sub>
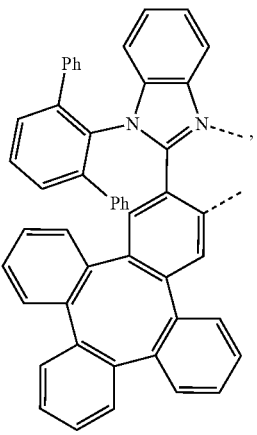
L<sub>a32</sub>

L<sub>a33</sub>
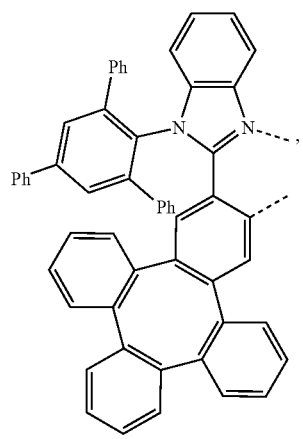
L<sub>a34</sub>
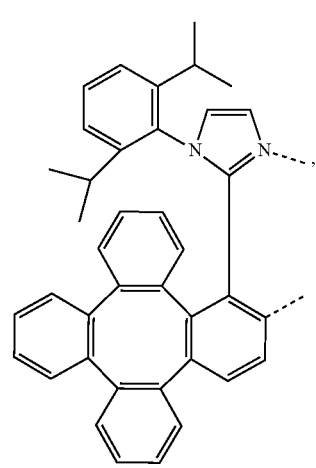
L<sub>a35</sub>
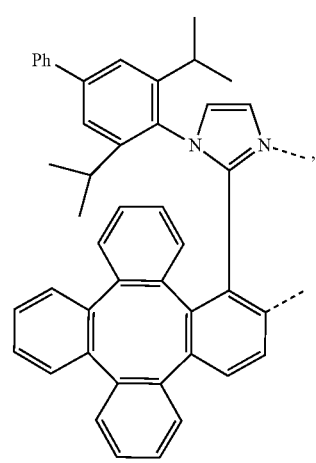
L<sub>a36</sub>
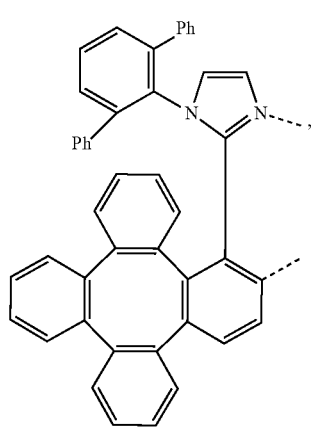
L<sub>a37</sub>
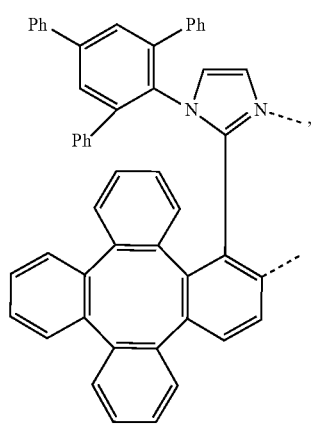
L<sub>a38</sub>
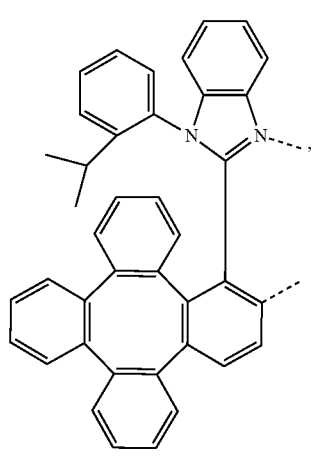

-continued
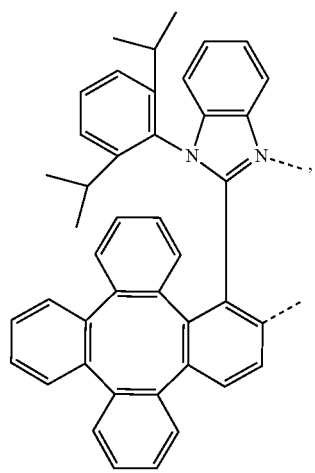
$L_{a39}$
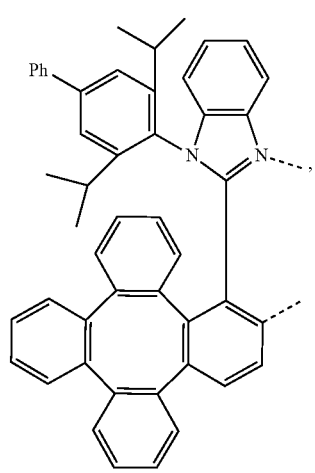
$L_{a40}$
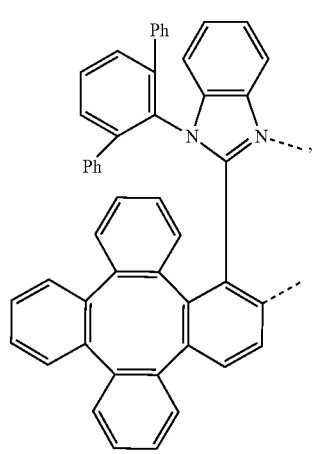
$L_{a41}$
-continued
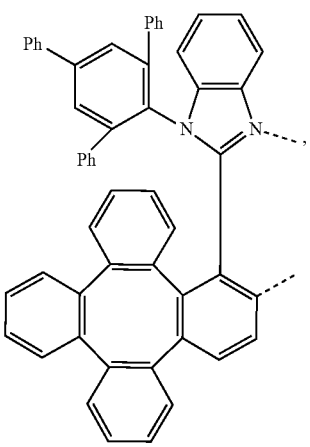
$L_{a42}$
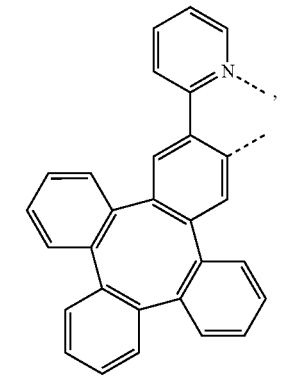
$L_{a43}$
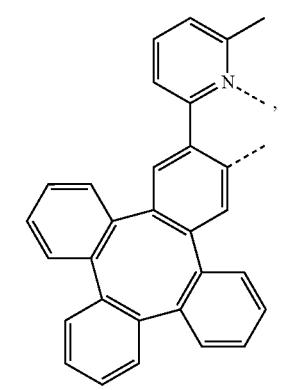
$L_{a44}$
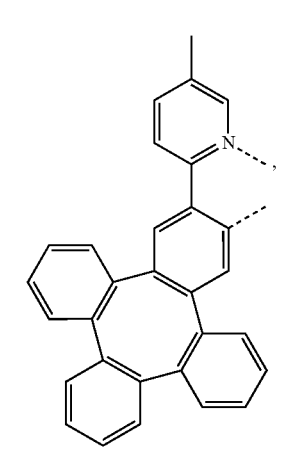
$L_{a45}$ L<sub>a46</sub>
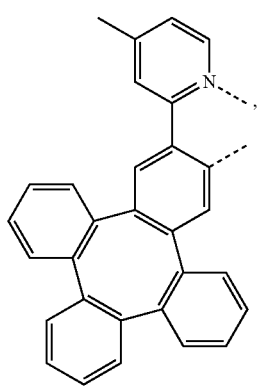
L<sub>a47</sub>
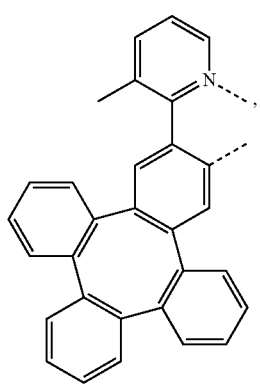
L<sub>a48</sub>
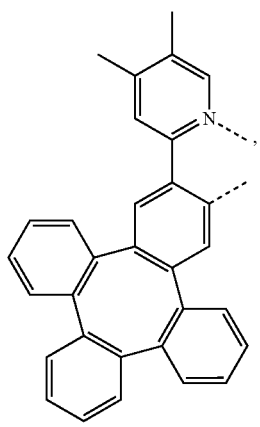
L<sub>a49</sub>
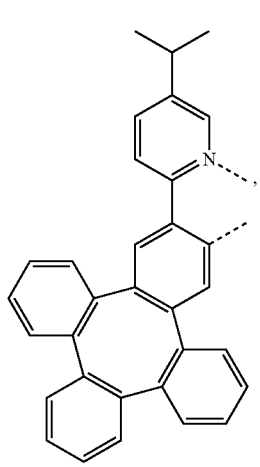
L<sub>a50</sub>
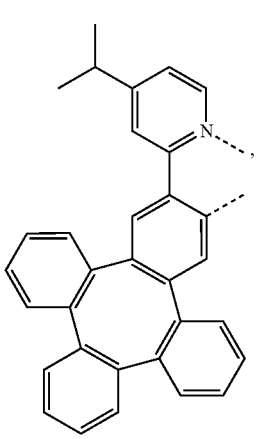
L<sub>a51</sub>
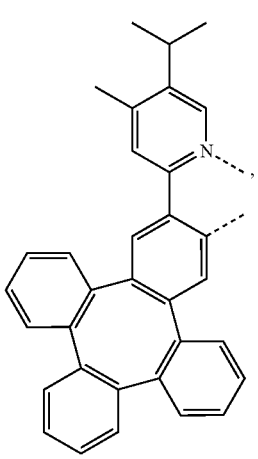
L<sub>a52</sub>
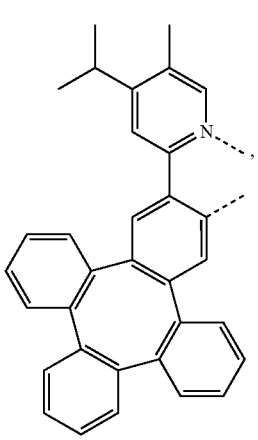

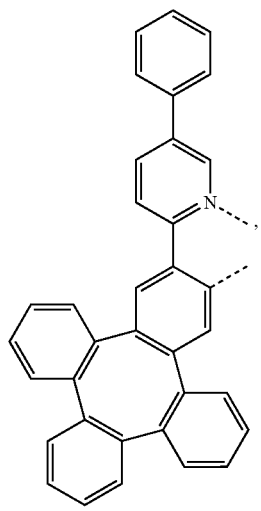 L<sub>a53</sub>
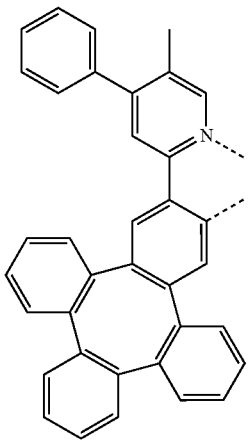 L<sub>a56</sub>
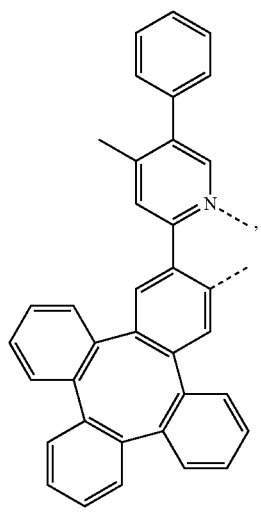 L<sub>a54</sub>
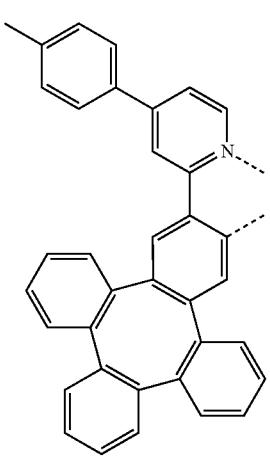 L<sub>a57</sub>
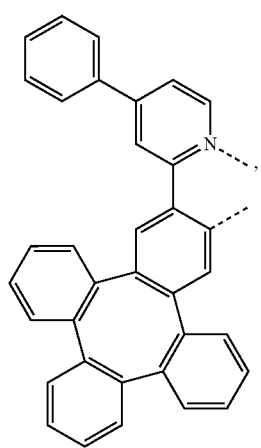 L<sub>a55</sub>
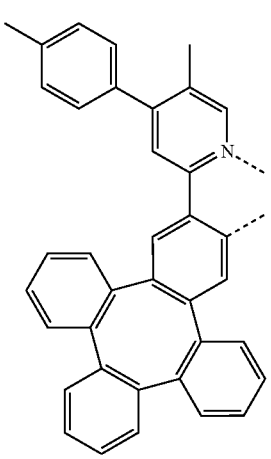 L<sub>a58</sub>

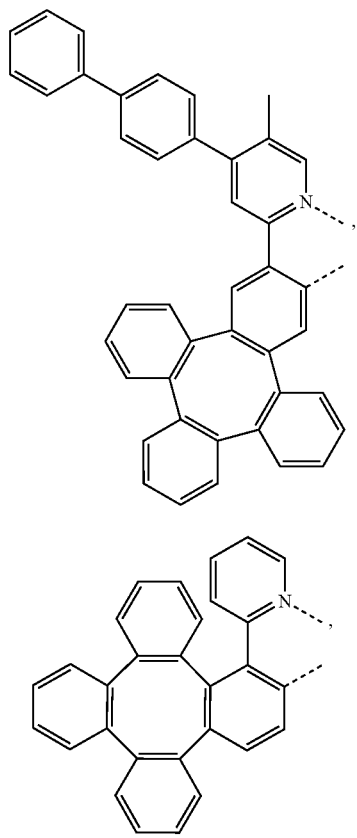 L<sub>a59</sub>
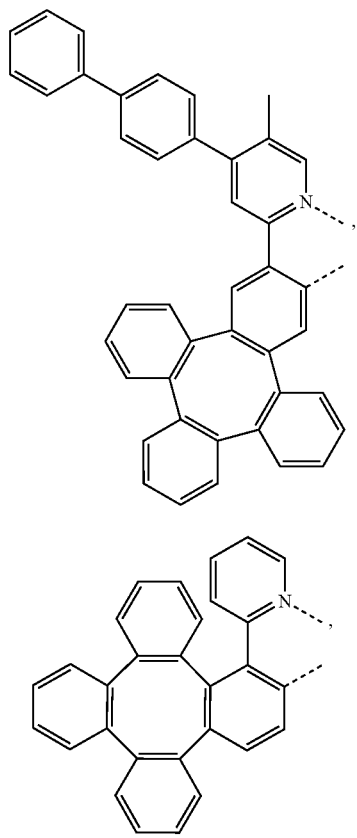 L<sub>a60</sub>
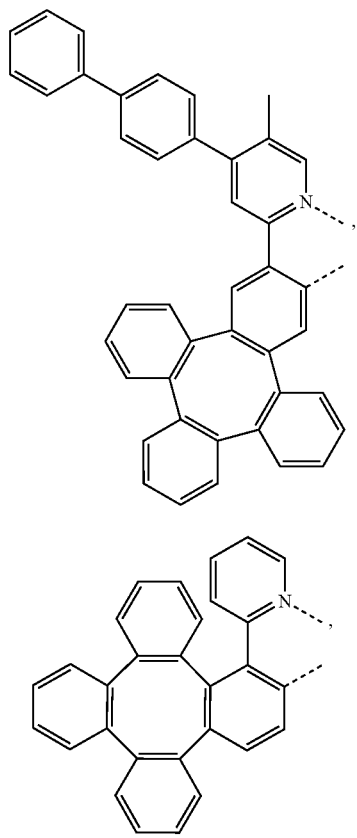 L<sub>a61</sub>
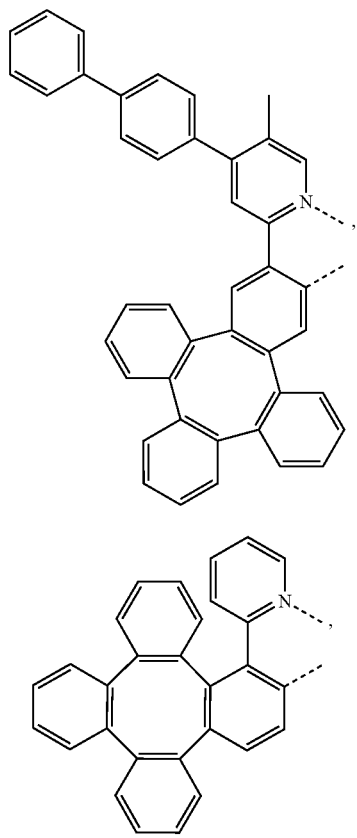 L<sub>a62</sub>
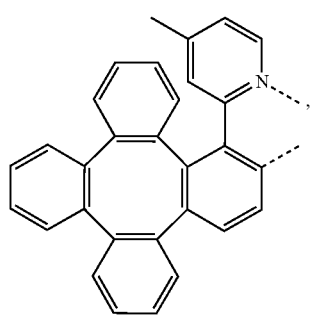 L<sub>a63</sub>
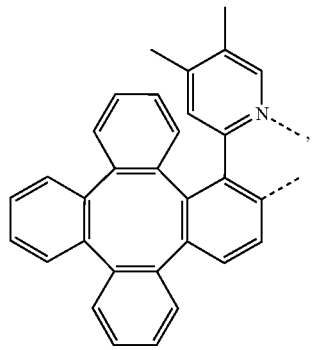 L<sub>a64</sub>
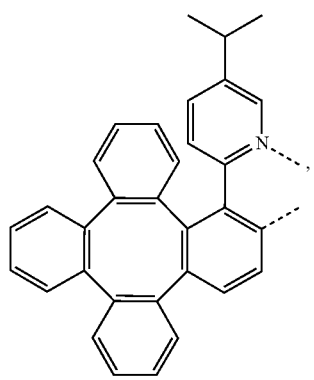 L<sub>a65</sub>
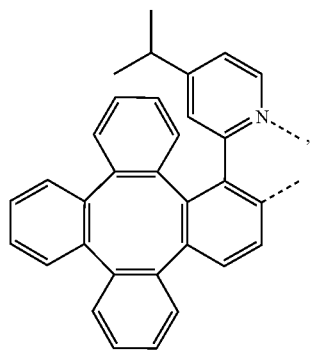 L<sub>a66</sub>

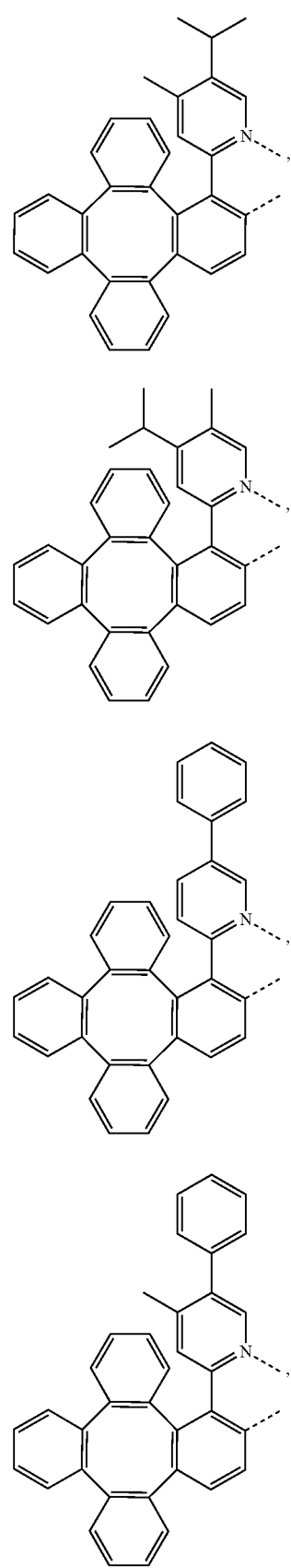
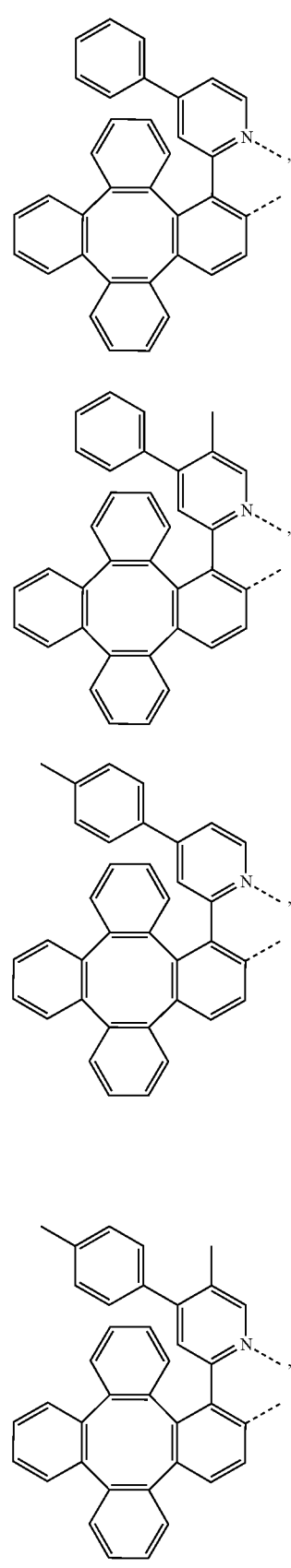

L<sub>a75</sub>
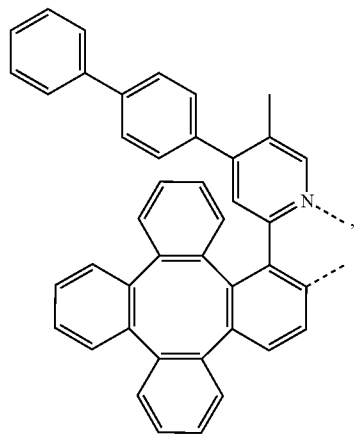
L<sub>a76</sub>
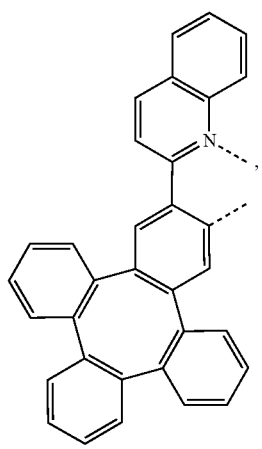
L<sub>a77</sub>
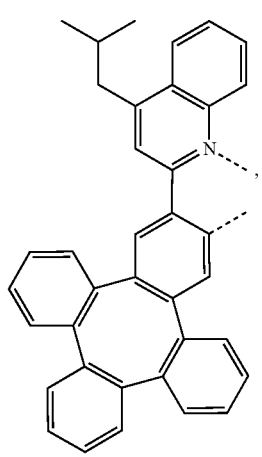
L<sub>a78</sub>
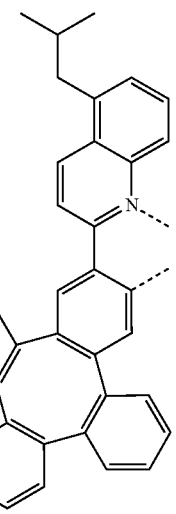
L<sub>a79</sub>
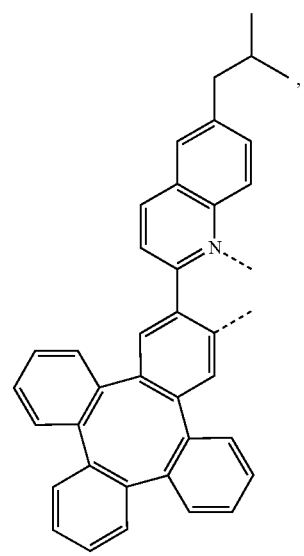
L<sub>a80</sub>
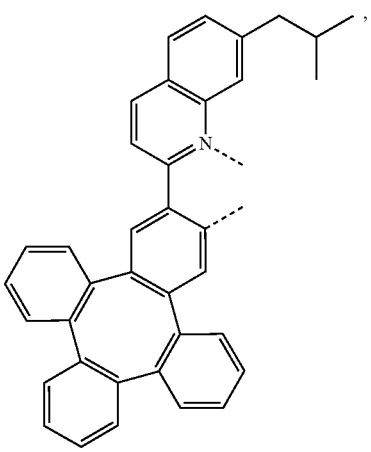

-continued
L<sub>a81</sub>
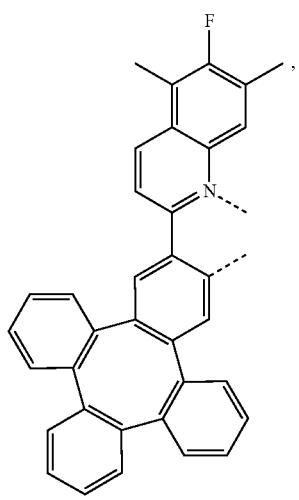
L<sub>a82</sub>
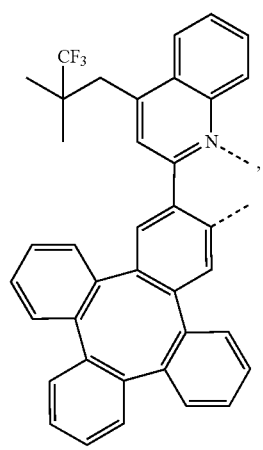
L<sub>a83</sub>
-continued
L<sub>a84</sub>
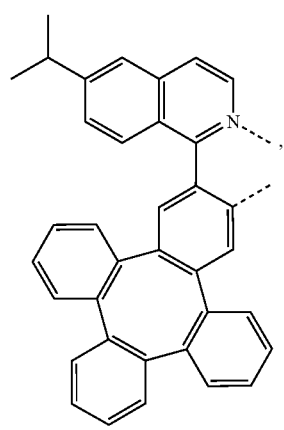
L<sub>a85</sub>
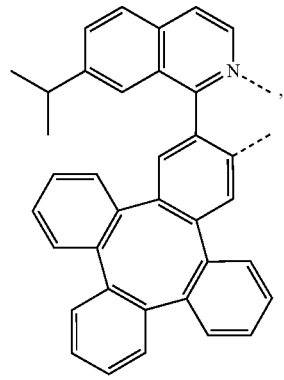
L<sub>a86</sub>
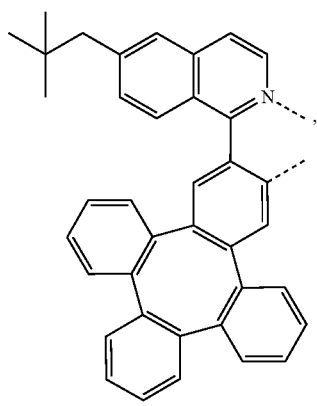
L<sub>a87</sub>
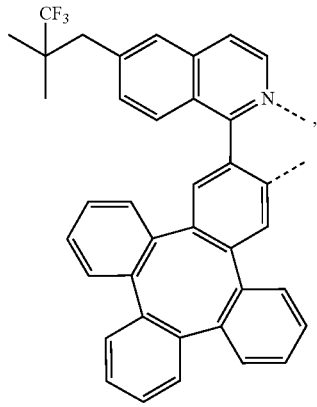

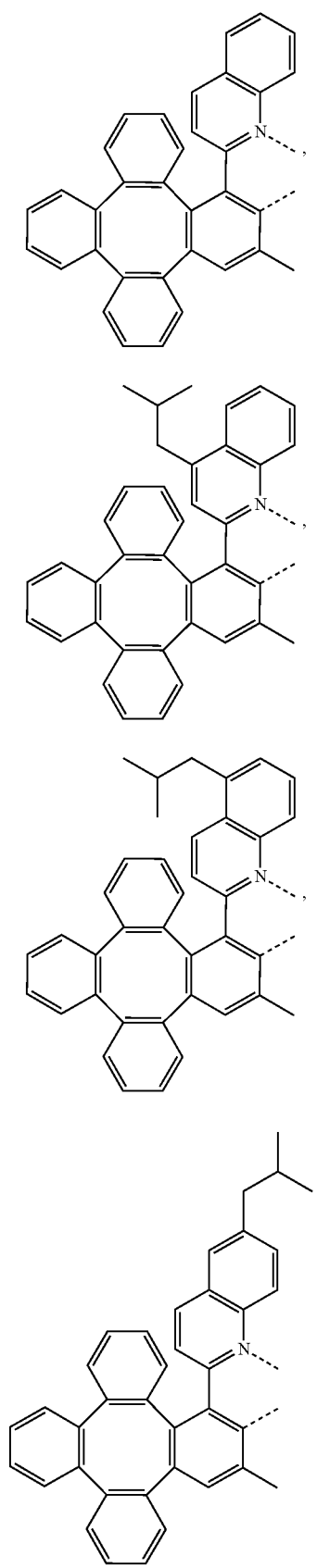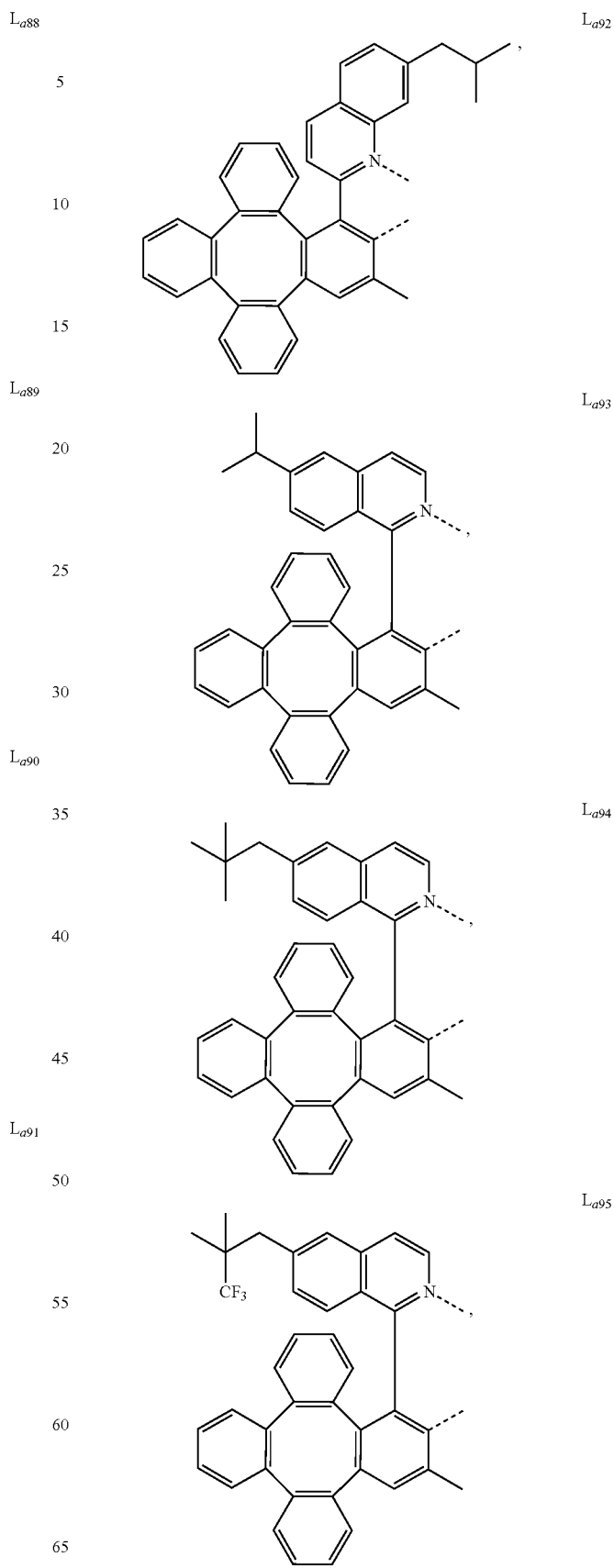

L<sub>a96</sub>
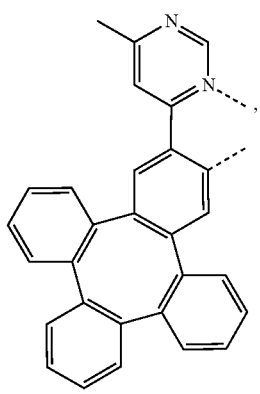
L<sub>a97</sub>
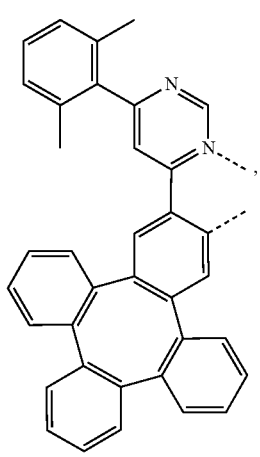
L<sub>a98</sub>
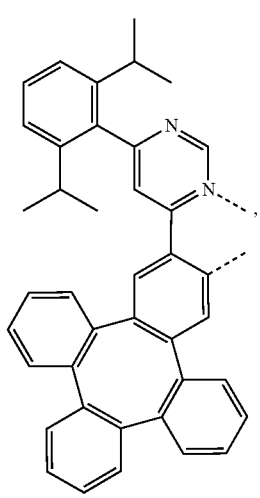
L<sub>a99</sub>
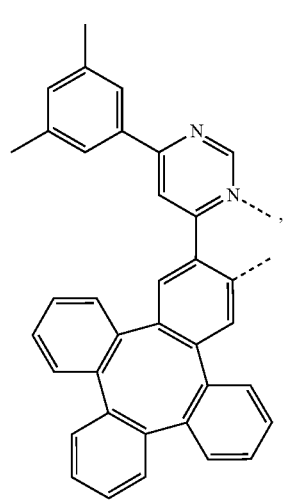
L<sub>a100</sub>
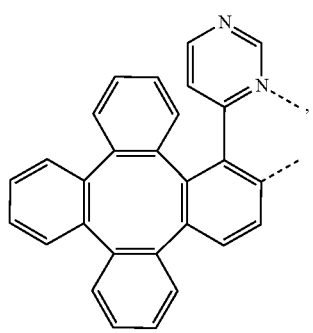
L<sub>a101</sub>
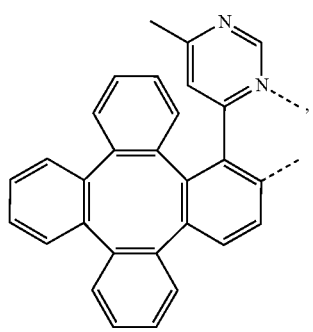
L<sub>a102</sub>
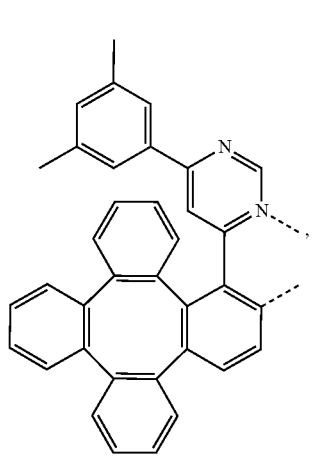

L<sub>a103</sub>
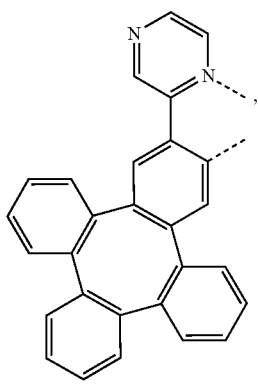
L<sub>a104</sub>
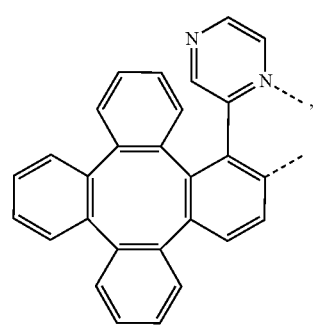
L<sub>a105</sub>
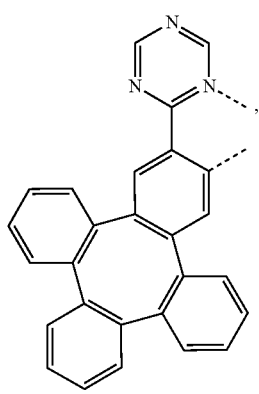
L<sub>a106</sub>
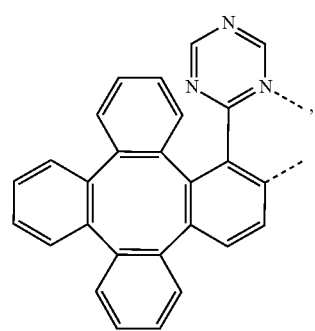
L<sub>a107</sub>
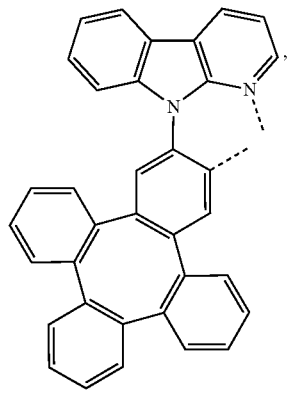
L<sub>a108</sub>
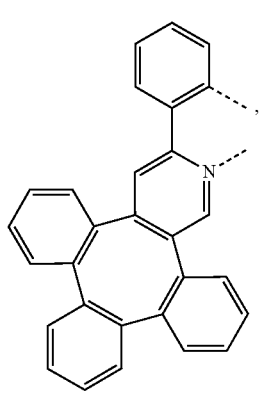
L<sub>a109</sub>
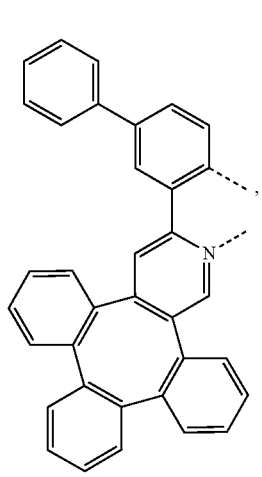

L<sub>a</sub>110
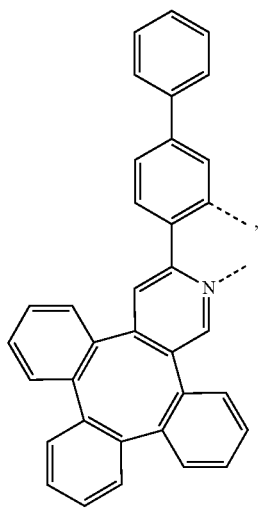
L<sub>a</sub>111
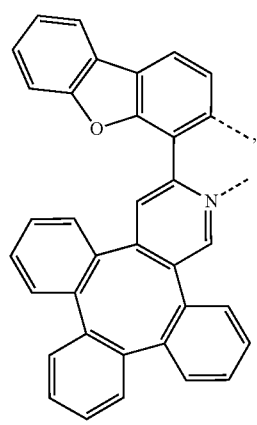
L<sub>a</sub>112
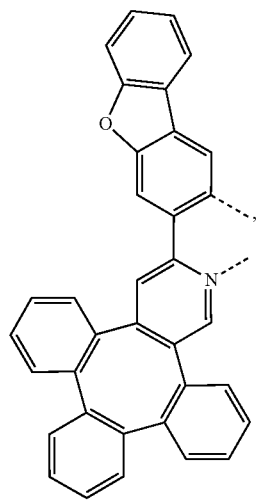
L<sub>a</sub>113
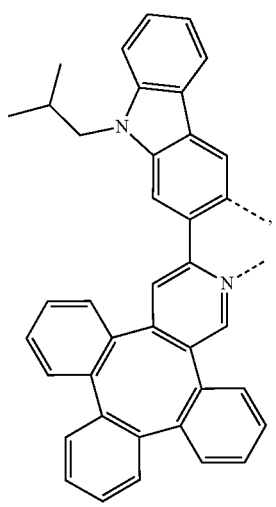
L<sub>a</sub>114
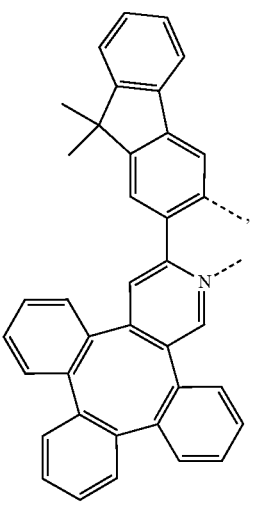
L<sub>a</sub>115
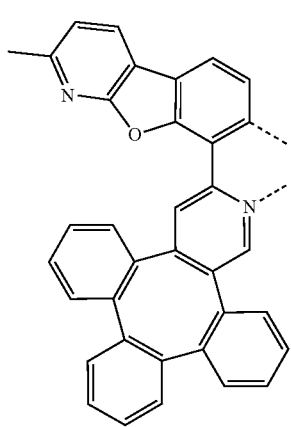

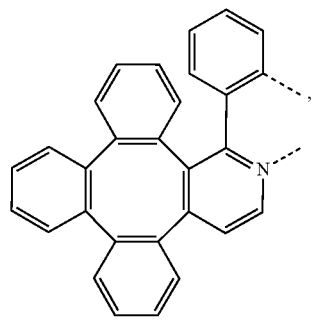
L_{a116}
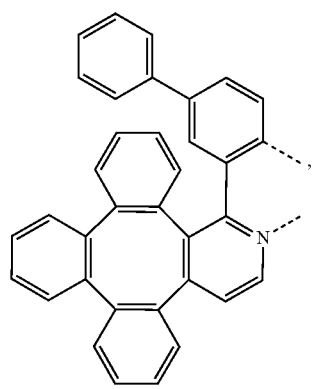
L_{a117}
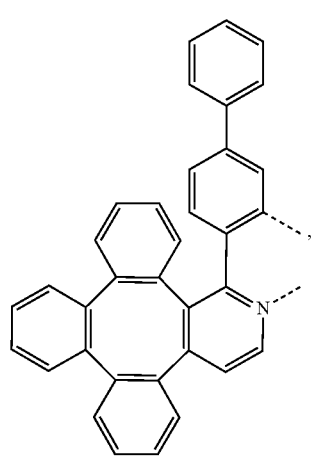
L_{a118}
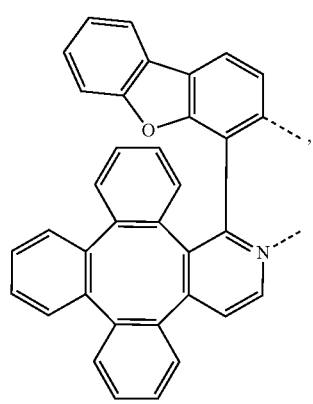
L_{a119}
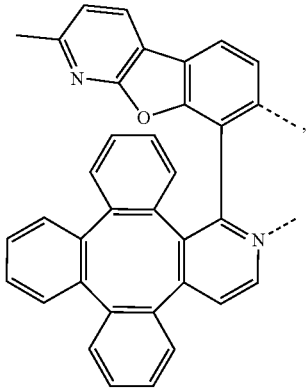
L_{a120}
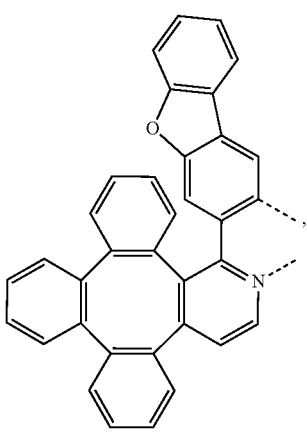
L_{a121}
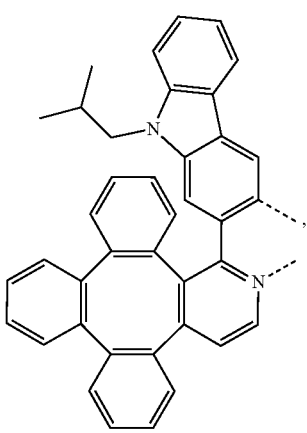
L_{a122}

L<sub>a123</sub>
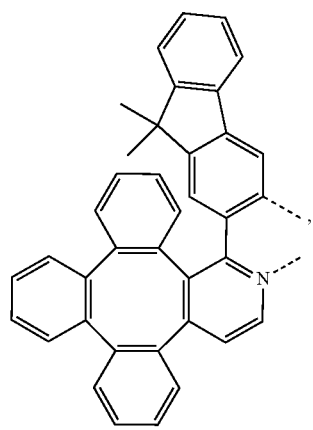
L<sub>a124</sub>
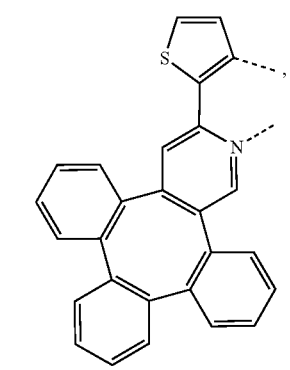
L<sub>a125</sub>
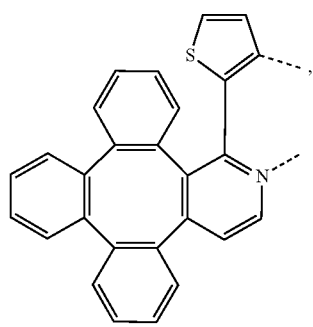
L<sub>a126</sub>
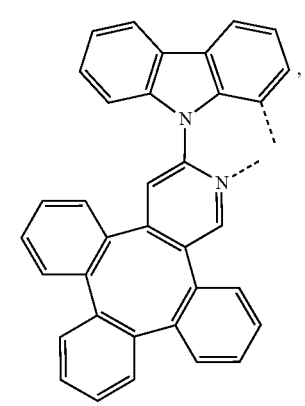
L<sub>a127</sub>
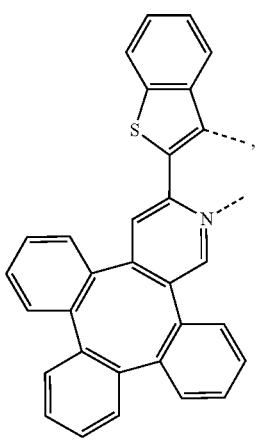
L<sub>a128</sub>
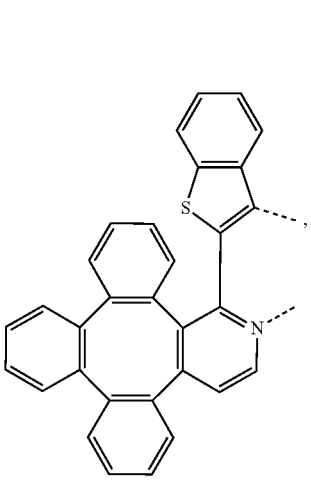
L<sub>a129</sub>
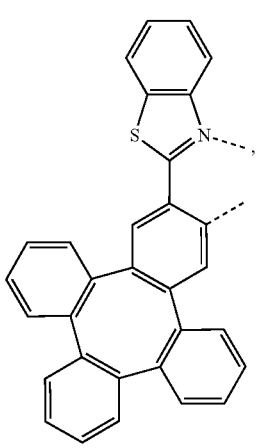

-continued

L$_{a130}$
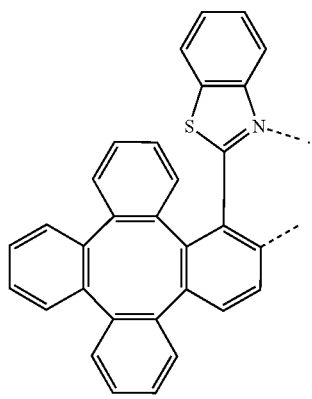

In one embodiment, wherein ligands L$_a$ can be partially or fully deuterated.

In one embodiment, wherein the complex has a structure according to formula 2 to 5:

Formula 2
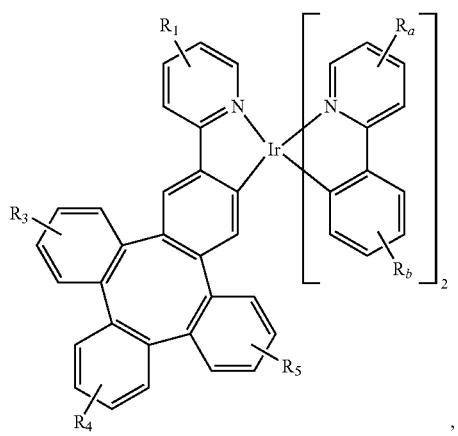

Formula 3
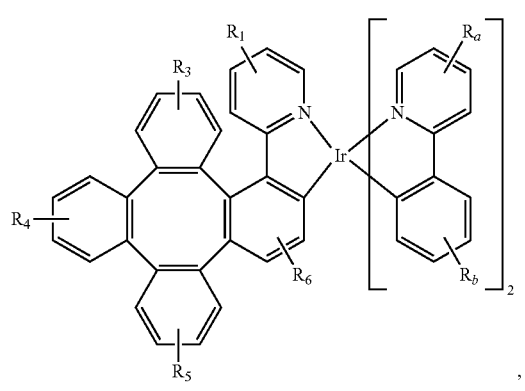

Formula 4
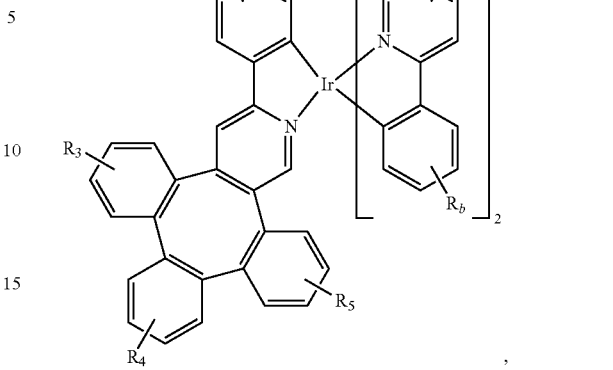

Formula 5
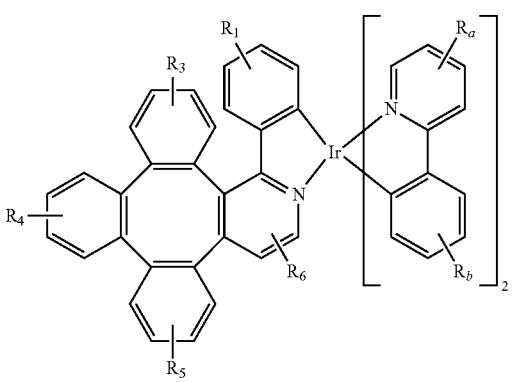

Wherein

R$_1$, R$_3$, R$_4$, R$_5$, R$_6$, R$_a$, and R$_b$ can represent mono, di, tri, or tetra substitution or no substitution;

R$_1$, R$_3$, R$_4$, R$_5$, R$_6$, R$_a$, and R$_b$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, nitrile, isonitrile, sulfanyl, sulfinyl, sulfonyl, phosphino, and combinations thereof;

two adjacent substituents are optionally joined to form a ring.

In one embodiment, wherein the metal complex has the formula of IrL$_a$(L$_b$)$_2$, L$_a$ is selected from any one of L$_{a1}$ to L$_{a130}$, and L$_b$ is selected from any one or both of the group consisting of:

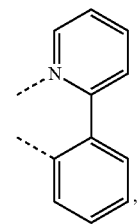 L*b*1
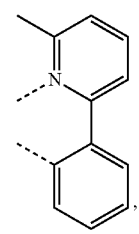 L*b*2
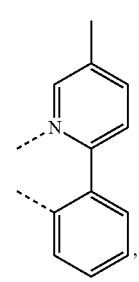 L*b*3
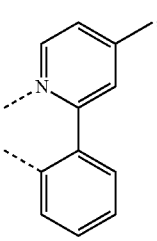 L*b*4
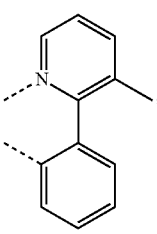 L*b*5
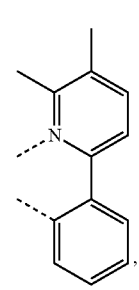 L*b*6
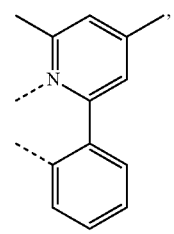 L*b*7
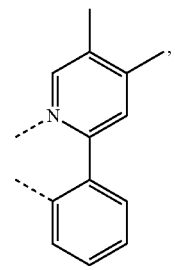 L*b*8
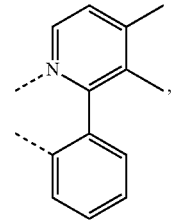 L*b*9
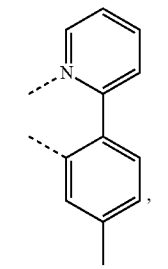 L*b*10
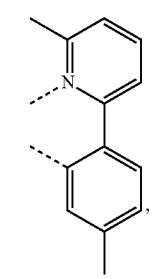 L*b*11
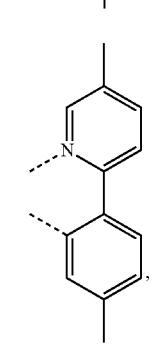 L*b*12

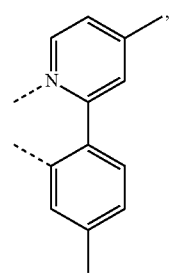 L_{b13}
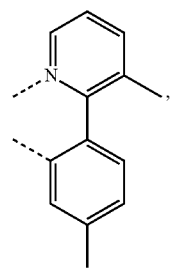 L_{b14}
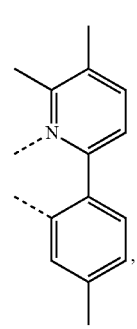 L_{b15}
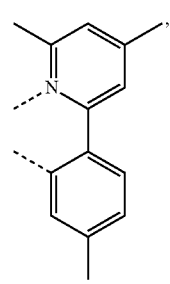 L_{b16}
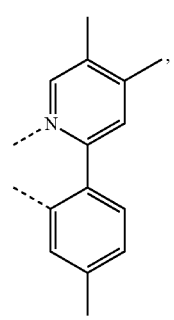 L_{b17}
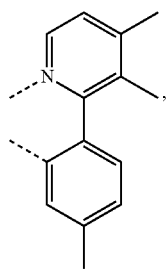 L_{b18}
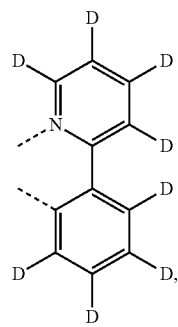 L_{b19}
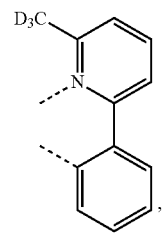 L_{b20}
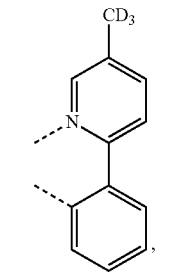 L_{b21}
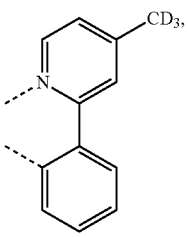 L_{b22}
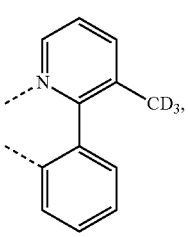 L_{b23}

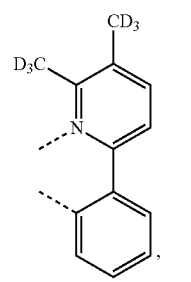 $L_{b24}$
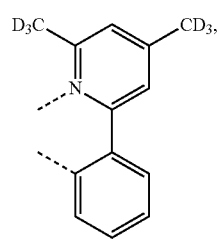 $L_{b25}$
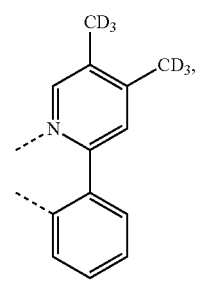 $L_{b26}$
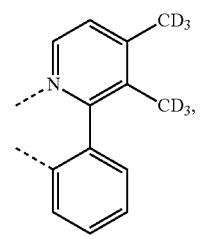 $L_{b27}$
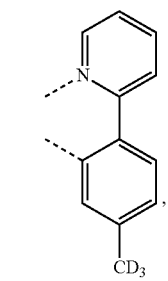 $L_{b28}$
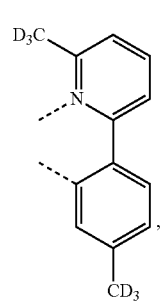 $L_{b29}$
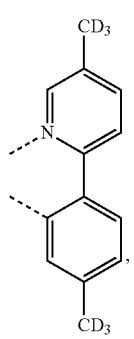 $L_{b30}$
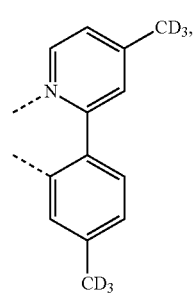 $L_{b31}$
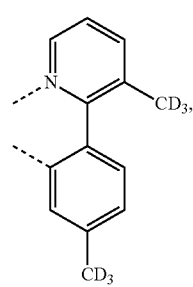 $L_{b32}$
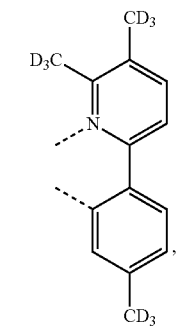 $L_{b33}$
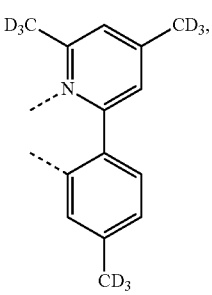 $L_{b34}$

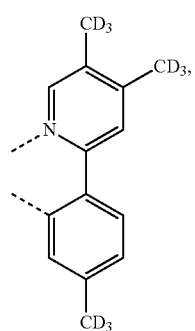  L_{b35}
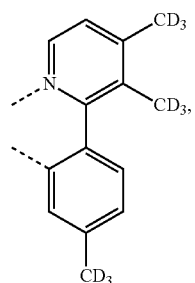  L_{b36}
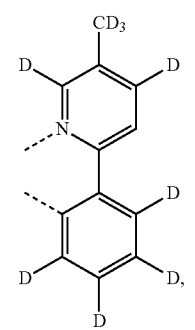  L_{b37}
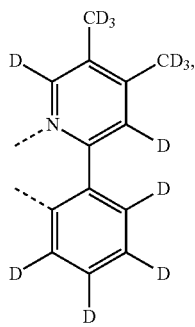  L_{b38}
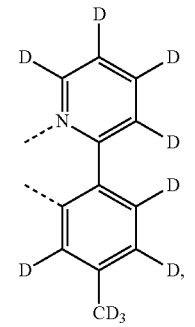  L_{b39}
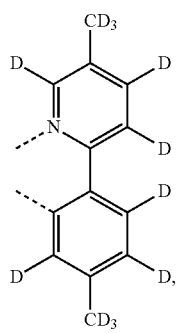  L_{b40}
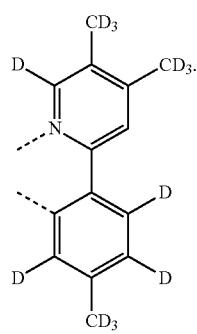  L_{b41}
In one embodiment, wherein the complex has the formula of $Ir(L_a)_2L_c$, $L_a$ is selected from any one or both of $L_{a1}$ to $L_{a130}$, and $L_c$ is selected from any one of the group consisting of:
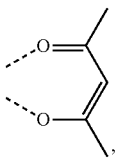  L_{c1}
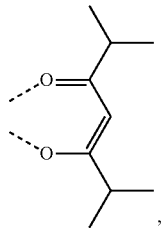  L_{c2}
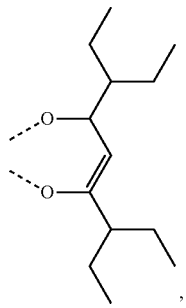  L_{c3}

L c4
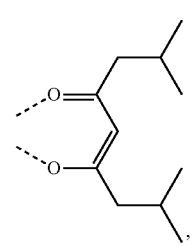
L c5
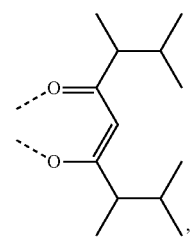
L c6
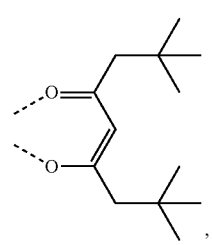
L c7
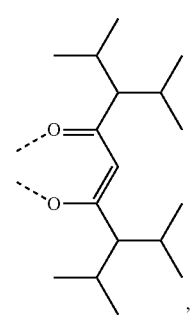
L c8
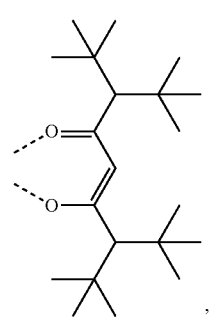
L c9
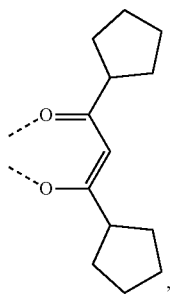
L c10
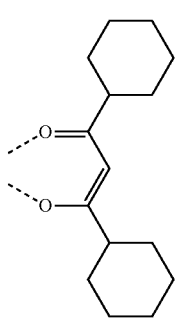
L c11
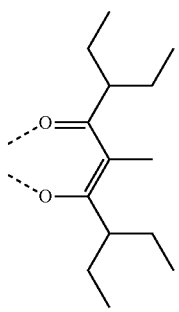
L c12
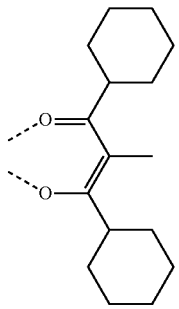
L c13
L c14
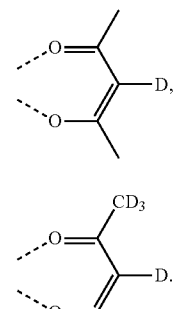

According to another embodiment, an electroluminescent device is disclosed. The electroluminescent device comprises: an anode, a cathode, and an organic layer, disposed between the anode and the cathode, the organic layer comprises a metal complex having a partial structure represented by Formula 1:

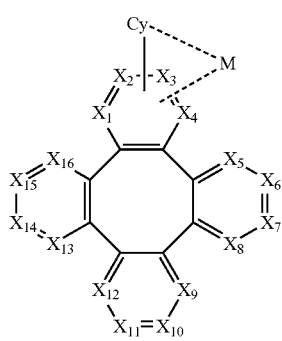

Formula 1

Wherein

Cy is a substituted or unsubstituted aryl or heteroaryl group having 5 to 24 aromatic ring atoms;

Cy is bonded to M via a carbon atom or nitrogen atom;

M is selected from the group consisting of Cu, Ag, Au, Ru, Rh, Pd, Os, Ir, and Pt;

$X_1$ to $X_{16}$ are independently selected from N, C, or CR;

wherein R is selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, nitrile, isonitrile, sulfanyl, sulfinyl, sulfonyl, phosphino, and combinations thereof;

two adjacent substituents are optionally joined to form a ring;

$X_1$, $X_2$, $X_3$ or $X_4$ is connected to M through a metal-carbon bond or metal-nitrogen bond.

In one embodiment, wherein the organic layer is an emissive layer and the compound is an emitter.

In one embodiment, wherein the organic layer further comprises a host.

In one embodiment, wherein the organic layer further comprises at least two hosts.

In one embodiment, wherein the host compound comprises at least one the chemical groups selected from the group consisting of benzene, biphenyl, carbazole, azacarbazole, indolocarbazole, dibenzothiophene, dibenzofuran, dibenzoselenophene, triphenylene, fluorene, silafluorene, naphthalene, phenanthrene, pyridine, pyrimidine, triazine, quinazoline, quinoxaline, azadibenzothiophene, azadibenzofuran, azadibenzoselenophene, azatriphenylene, azaphenanthrene and the combinations thereof.

In one embodiment, wherein said device is incorporated into another device selected from the group consisting of a consumer product, an electronic component module, an organic light-emitting device, and a lighting panel.

According to yet another embodiment, a formulation comprising a metal complex is also disclosed. The specific structure of the metal complex is described in any of the above embodiments.

Combination with Other Materials

The materials described herein as useful for a particular layer in an organic light emitting device may be used in combination with a wide variety of other materials present in the device. The combinations of these materials are described in more detail in U.S. Pat. App. No. 20160359122 at paragraphs 0132-0161, which are incorporated by reference in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, emissive dopants disclosed herein may be used in combination with a wide variety of hosts, transport layers, blocking layers, injection layers, electrodes and other layers that may be present. The combination of these materials is described in detail in paragraphs 0080-0101 of U.S. Pat. App. No. 20150349273, which are incorporated by reference in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatography-mass spectrometer produced by SHIMADZU, gas chromatography-mass spectrometer produced by SHIMADZU, differential Scanning calorimeters produced by SHIMADZU, fluorescence spectrophotometer produced by SHANGHAI LENGGUANG TECH., electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this patent.

Material Synthesis Example

The method for preparing the compounds of the present invention is not limited. The following compounds is exemplified as a typical but non-limiting example, and its synthesis route and preparation method are as follows:

1. Synthesis of Compound Ir(L$_{a43}$)(L$_{b1}$)$_2$

Step 1:

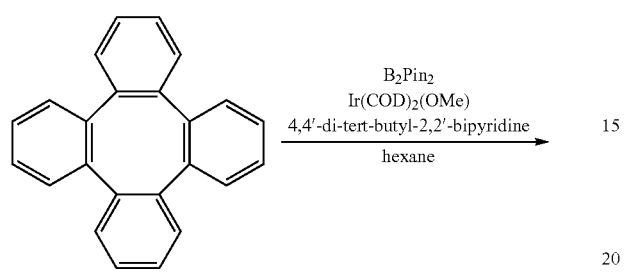

Tetraphenylene (10.6 g, 35 mmol), bis(pinacolato)diboron (8.8 g, 35.0 mmol), 4,4'-di-tert-butyl-2,2'-bipyridine (1.9 g, 7.0 mmol), (1,5-cyclooctadiene)(methoxy)iridium(I) dimer (2.3 g, 3.5 mmol) and anhydrous cyclohexane (250 mL) were mixed at room temperature, degassed with nitrogen and heated to reflux for 14 hours. The solvent was removed in vacuo. The residue was purified by flash column chromatography using 25%-40% of DCM in hexane to afford 4,4,5,5-tetramethyl-2-(tetraphenylen-2-yl)-1,3,2-dioxaborolane (3.2 g) as a white solid.

Step 2:

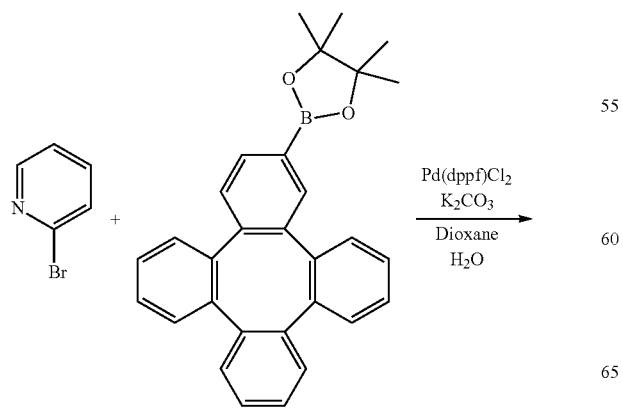

4,4,5,5-tetramethyl-2-(tetraphenylen-2-yl)-1,3,2-dioxaborolane (3.2 g, 7.4 mmol), 2-bromopyridine (1.1 g, 7.1 mmol), potassium carbonate (1.5 g, 10.6 mmol) were dissolved in a mixture of 1,4-dioxane (30 m L) and water (10 mL) to give a colorless suspension. Pd(dppf)Cl$_2$ (0.16 g, 0.2 mmol) was added to the reaction mixture, then the reaction mixture was degassed with nitrogen and heated to 100° C. for 12 hours. After the reaction was cooled down to room temperature, the product was extracted with DCM. The organic phase was separated and collected. The solvent was removed and the residue was coated on Celite and purified on silica gel column to give 1.9 g (71% yield) of 2-(tetraphenylen-2-yl)pyridine a white solid.

Step 3:

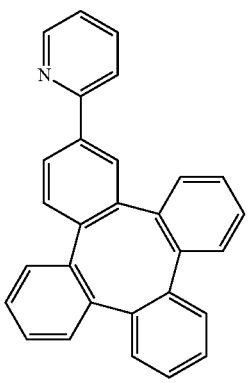

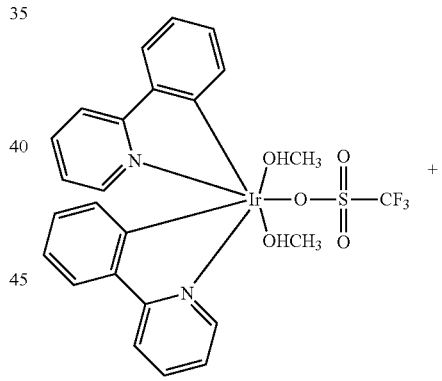

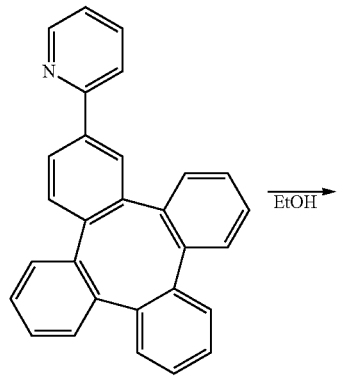

-continued

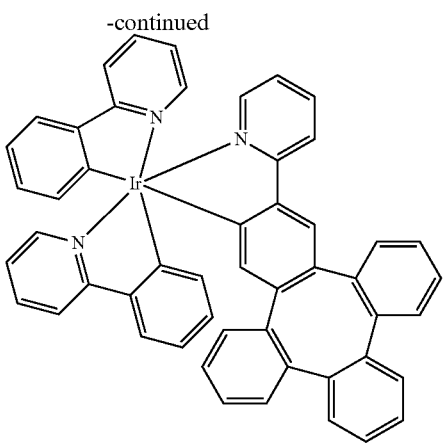

To a 500 mL round bottom flask was added the iridium (III) triflate complex (2.4 g, 3.3 mmol), 2-(tetraphenylen-2-yl)pyridine (1.9 g, 4.9 mmol) and 190 mL ethanol. The reaction mixture was refluxed overnight under nitrogen. The reaction mixture was cooled to room temperature and poured on top of a Celite plug. The plug was washed with methanol and hexane respectively to remove the impurities. The product was eluted from the celite with dichloromethane. The crude product was purified by column chromatography to give 0.87 g (30% yield) of $Ir(L_{a43})(L_{b1})_2$ as a yellow solid. The structure of the product was identified as the target product, having a molecular weight of 881.

The persons skilled in the art should know that the above preparation method is only an illustrative example, and the persons skilled in the art can obtain the structure of other compounds of the present invention by modifying the above preparation method.

Device Examples:

A glass substrate with 80 nm thick indium-tin-oxide (ITO) anode was first cleaned and then treated with oxygen plasma and UV ozone. After the treatments, the substrate was baked in a glovebox to remove moisture. The substrate was then mounted on a substrate holder and loaded into a vacuum chamber. The organic layers specified below were deposited in sequence by thermal vacuum deposition on the ITO anode at a rate of 0.2-2 Å/s at a vacuum level of around $10^{-8}$ torr. Compound HI was used as the hole injection layer (HIL). Compound HT was used as the hole transporting layer (HTL). Compound EB was used as the electron blocking layer (EBL). Then by co-deposition, the inventive compound or the comparative compound was doped in Compound EB and Compound HB as the emitting layer (EML). Compound HB was used as the hole blocking layer (HBL). On the HBL, a Compound ET and 8-Hydroxyquinolinolato-lithium(Liq) were co-deposited as the electron transporting layer (ETL). Finally, 1 nm of Liq was deposited as the electron injection layer and 120 nm of Al was deposited as the cathode. The device was then transferred back to the glovebox and encapsulated with a glass lid and a moisture getter.

The detailed device layer structure and thicknesses are shown in the table below. In the layers in which more than one material were used, they were obtained by doping different compounds in the weight ratios described therein.

TABLE 1

Device structure of device examples

| Device ID | HIL | HTL | EBL | EML | HBL | ETL |
|---|---|---|---|---|---|---|
| Example 1 | Compound HI (100 Å) | Compound HT (350 Å) | Compound EB (50 Å) | Compound EB:Compound HB:Compound $Ir(L_{a43})(L_{b1})_2$ (46:46:8) (400 Å) | Compound HB (100 Å) | Compound ET:Liq (35:65) (350 Å) |
| Comparative Example 1 | Compound HI (100 Å) | Compound HT (350 Å) | Compound EB (50 Å) | Compound EB:Compound HB:Compound A (46:46:8) (400 Å) | Compound HB (100 Å) | Compound ET:Liq (35:65) (350 Å) |
| Comparative Example 2 | Compound HI (100 Å) | Compound HT (350 Å) | Compound EB (50 Å) | Compound EB:Compound HB:Compound B (46:46:8) (400 Å) | Compound HB (100 Å) | Compound ET:Liq (35:65) (350 Å) |
| Comparative Example 3 | Compound HI (100 Å) | Compound HT (350 Å) | Compound EB (50 Å) | Compound EB:Compound HB:Compound C (46:46:8) (400 Å) | Compound HB (100 Å) | Compound ET:Liq (35:65) (350 Å) |
| Comparative Example 4 | Compound HI (100 Å) | Compound HT (350 Å) | Compound EB (50 Å) | Compound EB:Compound HB:Compound D (46:46:8) (400 Å) | Compound HB (100 Å) | Compound ET:Liq (35:65) (350 Å) |

The structures of the materials used in the devices are shown below:

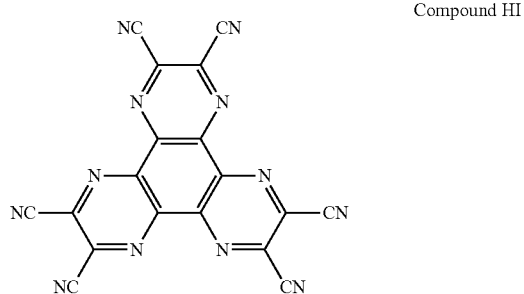

Compound HI

-continued
Compound HT
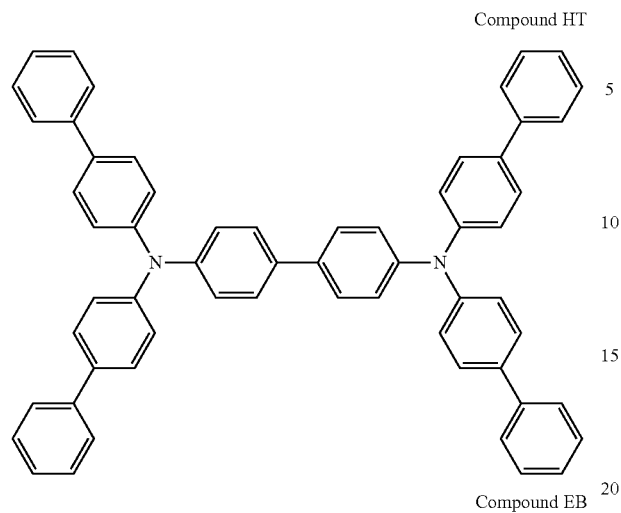
Compound A
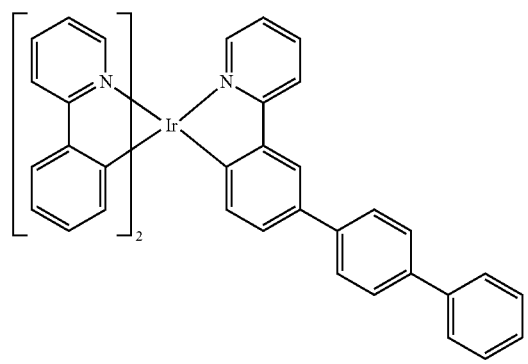
Compound EB
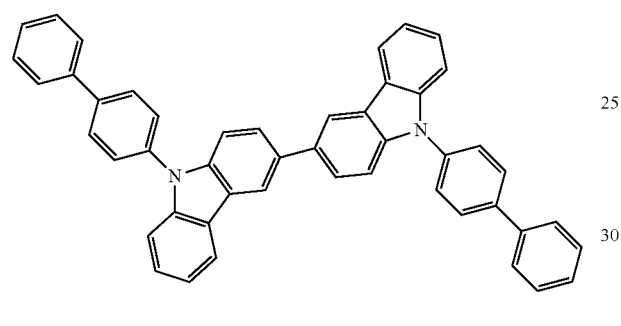
Compound B
Compound HB
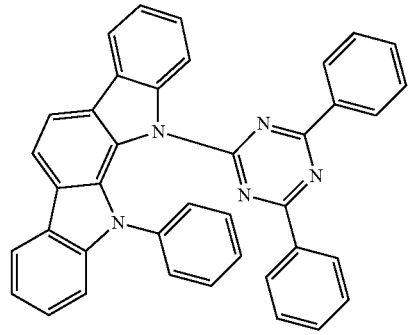
Compound C
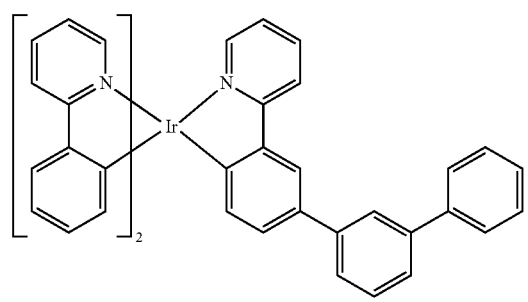
Compound ET
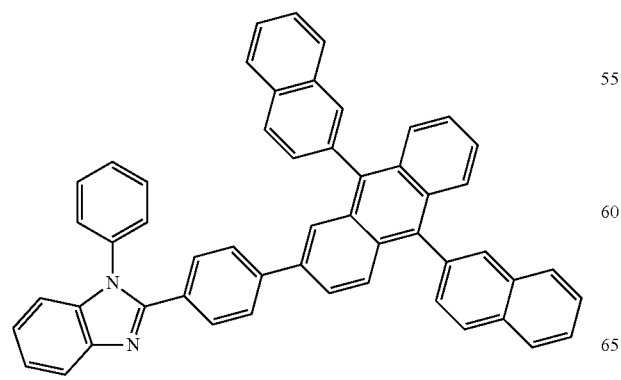
Compound D
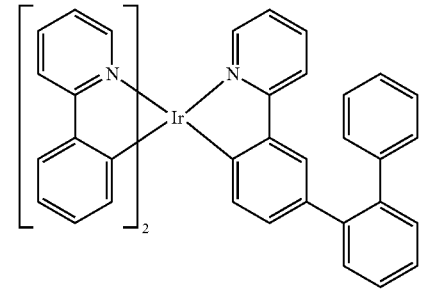

-continued

Compound Ir(L$_{a43}$)(L$_{b1}$)$_2$

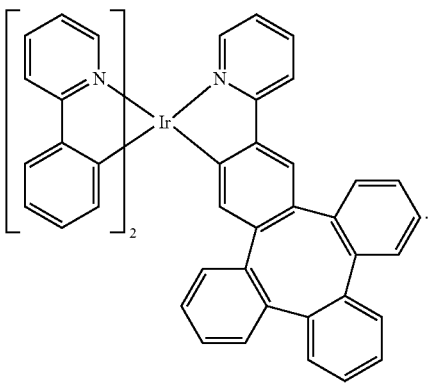

The IVL and lifetime characteristics of the devices were measured at various current densities and voltages. The luminance efficiency (LE), λ max, full width at half maximum (FWHM), voltage (V) and CIE data were measured at 1000 nits. The sublimation temperature (Sub T) of the material was recorded. The lifetime was tested at a constant current from an initial brightness of 10,000 nits.

TABLE 2

Device data

| Device ID | Sub T (° C.) | CIE (x, y) | λmax (nm) | FWHM (nm) | Voltage (V) | LE (cd/A) | LT95 (hour) |
|---|---|---|---|---|---|---|---|
| Example 1 | 282 | 0.308, 0.639 | 519 | 63 | 3.19 | 70 | 376 |
| Comparative Example 1 | 276 | 0.311, 0.637 | 520 | 63 | 2.95 | 73 | 346 |
| Comparative Example 2 | 257 | 0.294, 0.643 | 517 | 60 | 2.86 | 67 | 267 |
| Comparative Example 3 | 263 | 0.299, 0.642 | 517 | 61 | 2.87 | 71 | 168 |
| Comparative Example 4 | 238 | 0.297, 0.641 | 517 | 62 | 2.82 | 76 | 58 |

Discussion:

As shown from the data in Table 2, the CIE, λ max, full width at half maximum (FWHM), voltage and luminance efficiency of the devices are similar. They show high luminance efficiencies and low voltages. But most importantly, Example 1 with Compound Ir(L$_{a43}$)(L$_{b1}$)$_2$ as the emitter has the best lifetime. The difference between Compound Ir(L$_{a43}$)(L$_{b1}$)$_2$ and Compounds A-D is that Compound Ir(L$_{a43}$)(L$_{b1}$)$_2$ has a tetraphenylene ring compared to non-cyclic phenylene linkages. It demonstrates that compounds of Formula 1, characterized by the tetraarylene or tetraheteroarylene rings can offer high efficiency and long lifetime in devices.

It is understood that the various embodiments described herein are by way of example only and are not intended to limit the scope of the invention. The present invention as claimed may therefore include variations from the particular examples and preferred embodiments described herein, as will be apparent to one of skill in the art. Many of the materials and structures described herein may be substituted with other materials and structures without deviating from the spirit of the invention. It is understood that various theories as to why the invention works are not intended to be limiting.

What is claimed is:

1. A metal complex having the formula of M(L$_a$)$_m$(L$_b$)$_n$(L$_c$)$_q$, wherein L$_a$ is independently selected from the group consisting of:

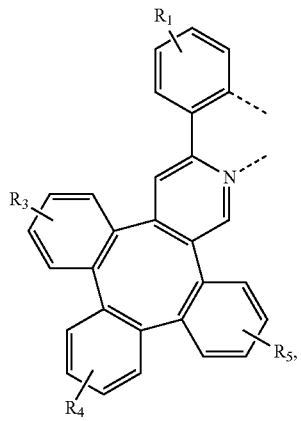

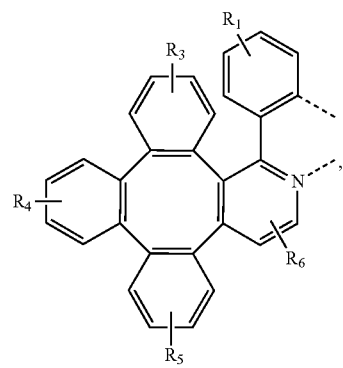

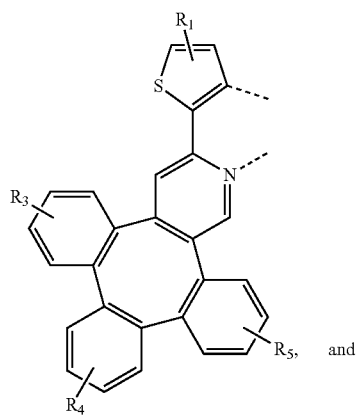

and

-continued

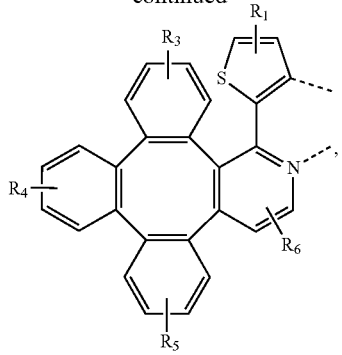

wherein,
$L_b$ and $L_c$ are the second and third ligand coordinating to M;
$L_b$ and $L_c$ can be the same or different;
$L_a$, $L_b$, and $L_c$ can be optionally joined to form a tetradentate or hexadentate ligand;
m is 1, 2, or 3;
n is 0, 1, or 2;
q is 0, 1, or 2;
m+n+q is the oxidation state of M;
M is selected from the group consisting of Cu, Ag, Au, Ru, Rh, Pd, Os, Ir, and Pt;
$R_1$, $R_3$, $R_4$, $R_5$ and $R_6$ independently represent mono, di, tri, or tetra substitution or no substitution;
$R_3$, $R_4$, $R_5$, and $R_6$ are independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 12 carbon atoms, a substituted or unsubstituted heteroaryl group having 3 to 12 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, nitrile, isonitrile, sulfanyl, sulfinyl, sulfonyl, phosphino, and combinations thereof;
$R_1$ is selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, nitrile, isonitrile, sulfanyl, sulfinyl, sulfonyl, phosphino, and combinations thereof;
two adjacent substituents are optionally joined to form a ring;
$L_b$ and $L_c$ are independently selected from the group consisting of:

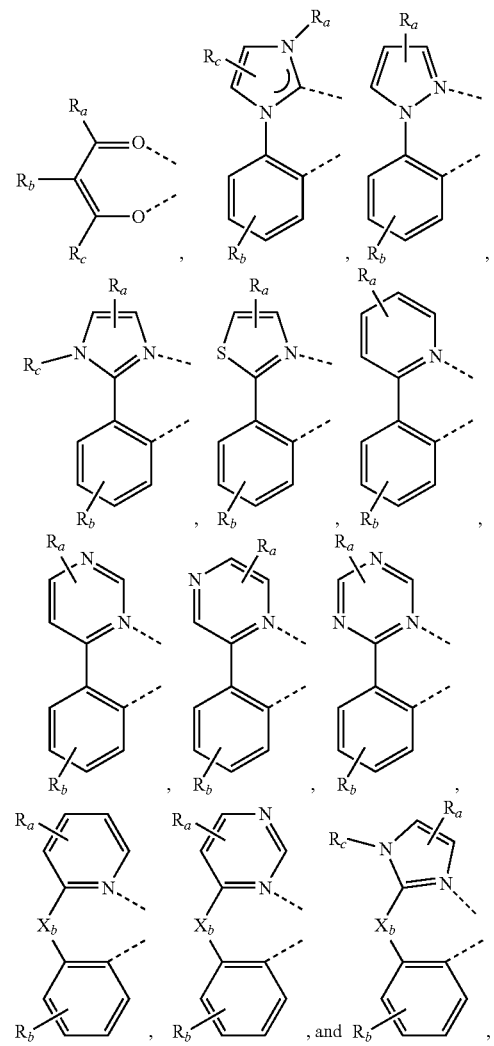

wherein
$R_a$, $R_b$, and $R_c$ can represent mono, di, tri, or tetra substitution or no substitution;
$X_b$ is selected from the group consisting of O, S, Se, $NR_{N1}$, and $CR_{C1}R_{C2}$,
$R_a$, $R_b$, $R_c$, $R_{N1}$, $R_{C1}$, and $R_{C2}$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, nitrile, isonitrile, sulfanyl, sulfinyl, sulfonyl, phosphino, and combinations thereof;

two adjacent substituents are optionally joined to form a ring.

2. The metal complex of claim 1, wherein the metal is selected from the group consisting of Pt and Ir.

3. The metal complex of claim 1, wherein $L_a$ is selected from the group consisting of:

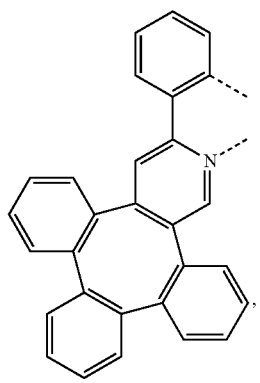

$L_{a108}$

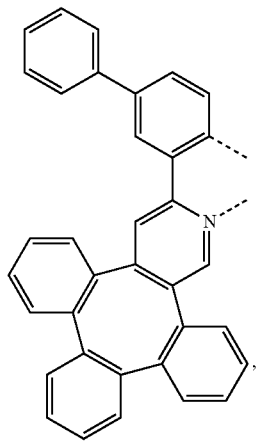

$L_{a109}$

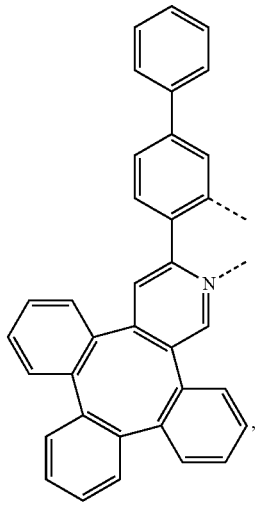

$L_{a110}$

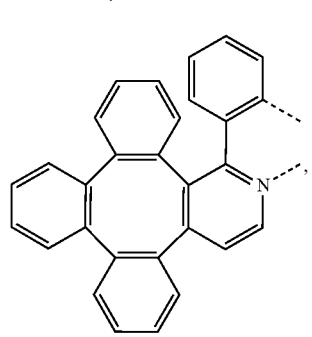

$L_{a116}$

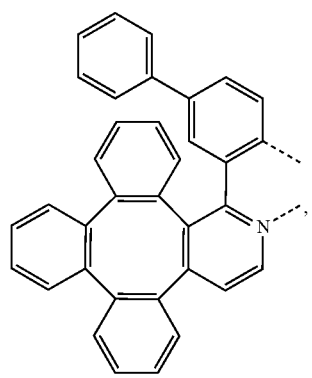

$L_{a117}$

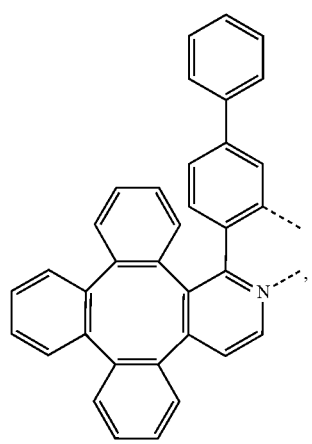

$L_{a118}$

-continued

L_{a124}
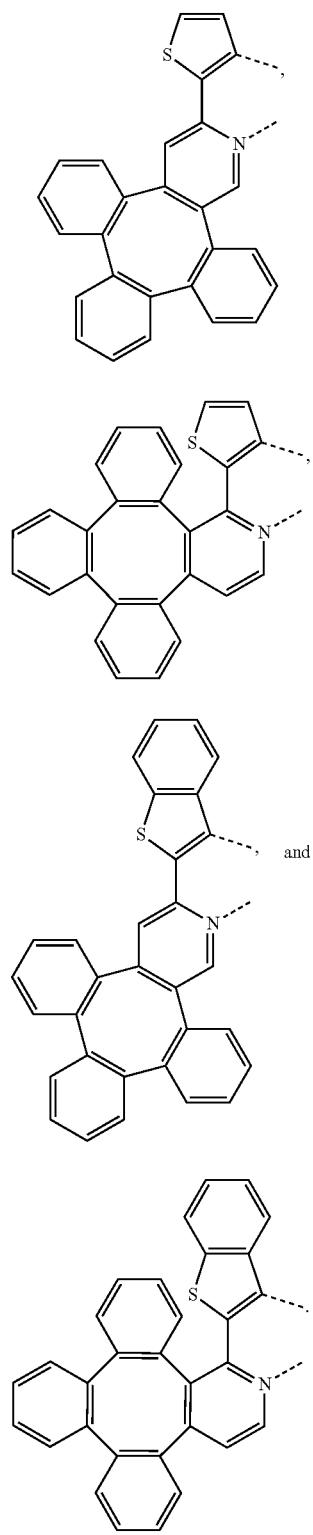

L_{a125}

L_{a127} and

L_{a128}

4. The metal complex of claim 3, wherein ligand $L_a$ is partially or fully deuterated.

5. The metal complex of claim 1, wherein the complex has a structure according to formula 4 or formula 5:

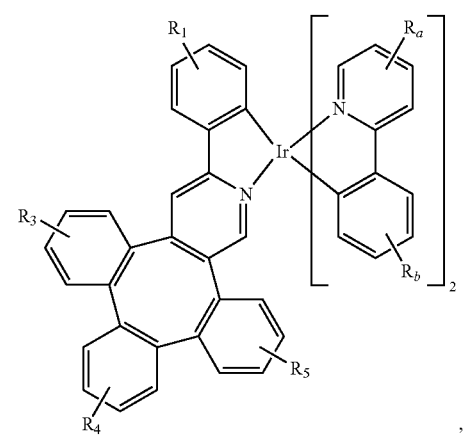
Formula 4

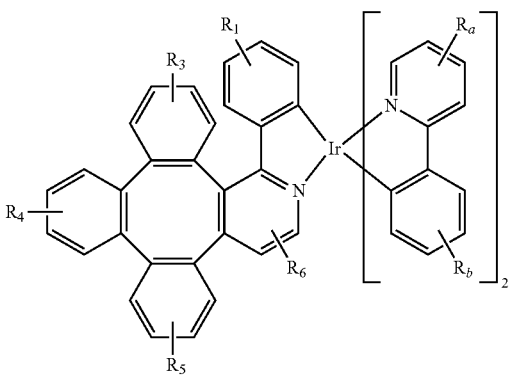
Formula 5

6. The metal complex of claim 3, wherein the metal complex has the formula of $IrL_a(L_b)_2$, $L_a$ is selected from any one of $L_{a108}$ to $L_{a110}$, $L_{a116}$ to $L_{a118}$, $L_{a124}$ to $L_{a125}$, and $L_{a127}$ to $L_{a128}$, and $L_b$ is in each case independently selected from the group consisting of:

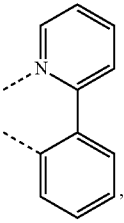
$L_{b1}$

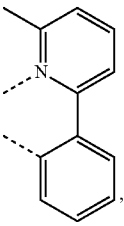
$L_{b2}$

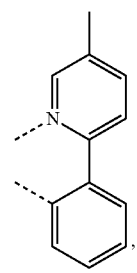 L_{b3}
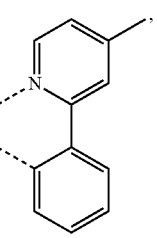 L_{b4}
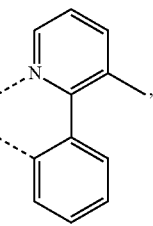 L_{b5}
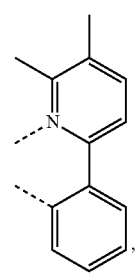 L_{b6}
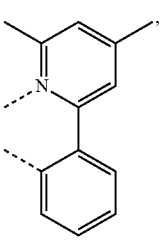 L_{b7}
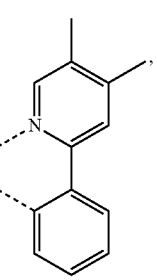 L_{b8}
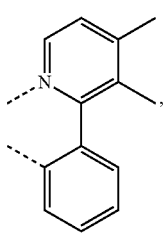 L_{b9}
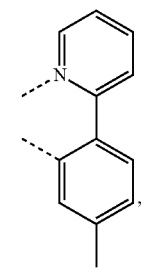 L_{b10}
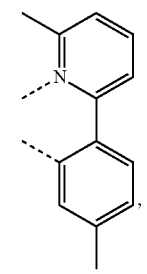 L_{b11}
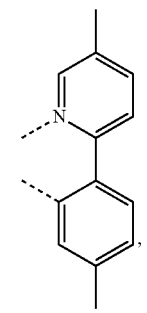 L_{b12}
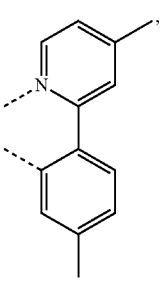 L_{b13}

-continued
L<sub>b</sub>14 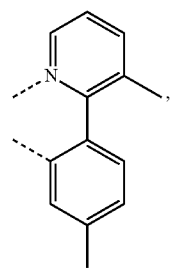
L<sub>b</sub>15 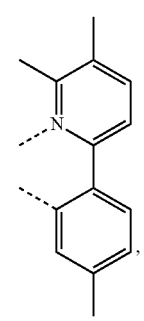
L<sub>b</sub>16 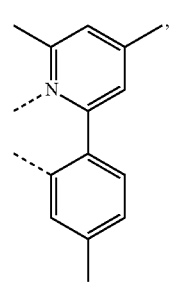
L<sub>b</sub>17 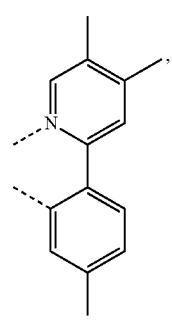
L<sub>b</sub>18 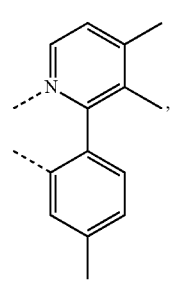
-continued
L<sub>b</sub>19 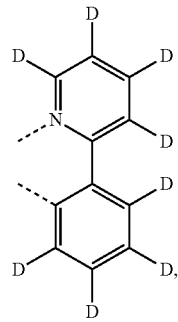
L<sub>b</sub>20 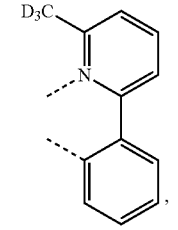
L<sub>b</sub>21 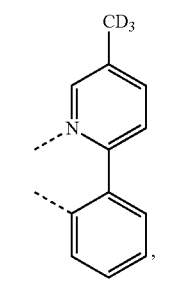
L<sub>b</sub>22 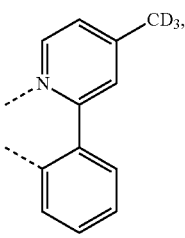
L<sub>b</sub>23 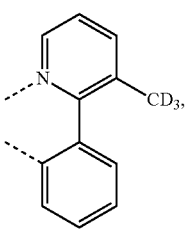
L<sub>b</sub>24 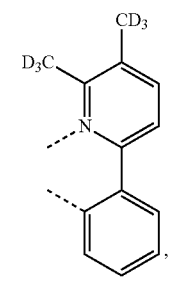

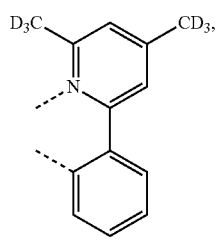 L<sub>b25</sub>
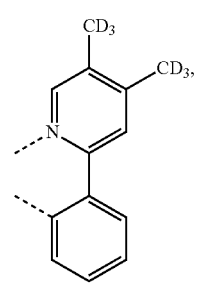 L$_{b26}$
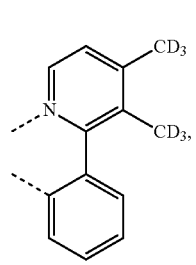 L$_{b27}$
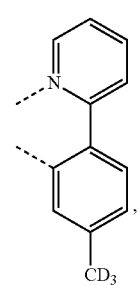 L$_{b28}$
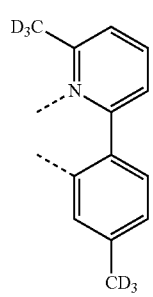 L$_{b29}$
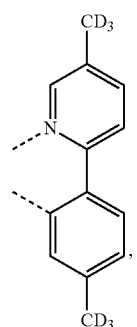 L$_{b30}$
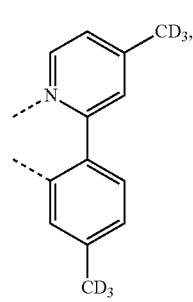 L$_{b31}$
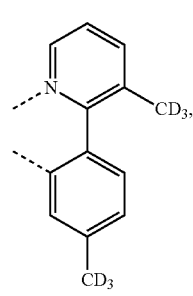 L$_{b32}$
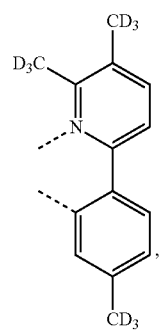 L$_{b33}$
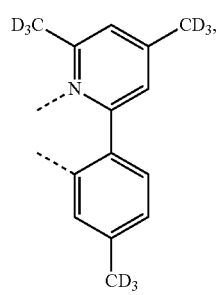 L$_{b34}$ L<sub>b35</sub>
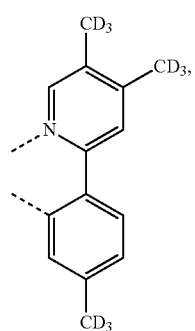

L<sub>b36</sub>
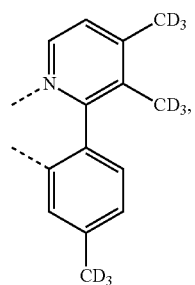

L<sub>b37</sub>
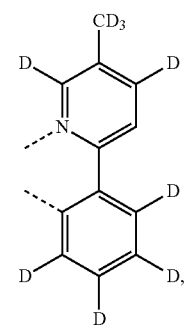

L<sub>b38</sub>
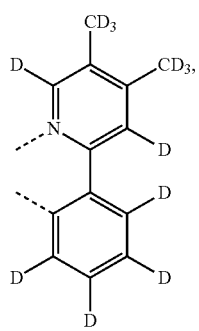

L<sub>b39</sub>
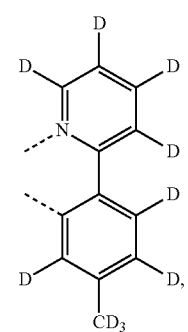

L<sub>b40</sub>
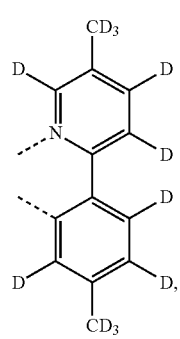

L<sub>b41</sub>
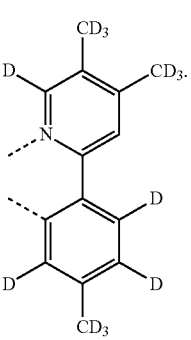

7. The metal complex of claim 3, wherein the metal complex has the formula of Ir(L$_a$)$_2$L$_c$, L$_a$ is in each case independently selected from L$_{a108}$ to L$_{a110}$, L$_{a116}$ to L$_{a118}$, L$_{a124}$ to L$_{a125}$, and L$_{a127}$ to L$_{a128}$, and L$_c$ is selected from any one of the group consisting of:

L<sub>c1</sub>
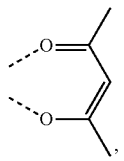

L<sub>c2</sub>
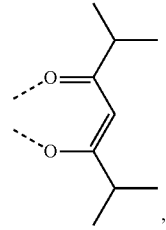

L<sub>c3</sub>
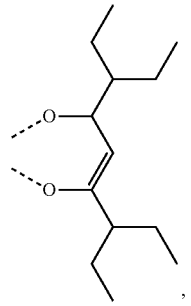

-continued
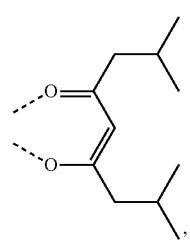
L_{c4},
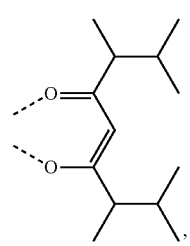
L_{c5},
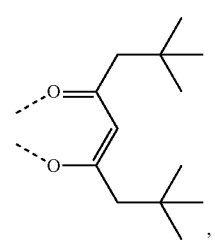
L_{c6},
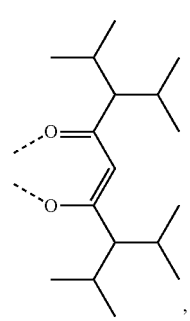
L_{c7},
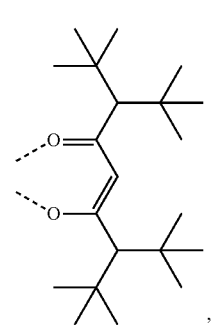
L_{c8},
-continued
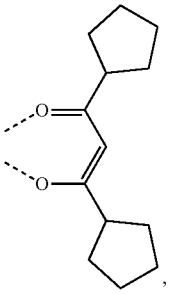
L_{c9},
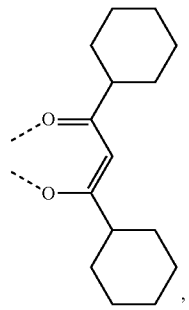
L_{c10},
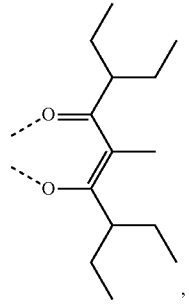
L_{c11},
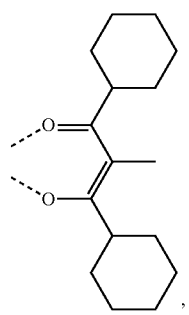
L_{c12},
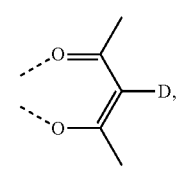
L_{c13}
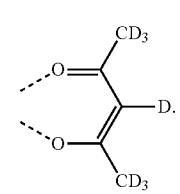
L_{c14}

8. An electroluminescent device, comprising:
an anode,
a cathode,
and an organic layer, disposed between the anode and the cathode, comprising the metal complex of claim 1.

9. The device of claim 8, wherein the organic layer is an emissive layer and the complex is an emitter.

10. The device of claim 8, wherein the organic layer further comprises a host.

11. The device of claim 8, wherein the organic layer comprises at least two hosts.

12. The device of claim 10, wherein the host compound comprises at least one of the chemical groups selected from the group consisting of carbazole, azacarbazole, indolocarbazole, dibenzothiophene, dibenzofuran, triphenylene, naphthalene, phenanthrene, triazine, quinazoline, quinoxaline, azadibenzothiophene, azadibenzofuran, and the combinations thereof.

13. The device of claim 8, wherein the electroluminescent device is incorporated into another device selected from the group consisting of a consumer product, an electronic component module, an organic light-emitting device, and a lighting panel.

14. A formulation comprises the metal complex of claim 1.

* * * * *